(12) United States Patent
Lin et al.

(10) Patent No.: US 10,935,215 B1
(45) Date of Patent: Mar. 2, 2021

(54) POLARIZATION SELECTIVE OPTIC FOR GLARE CONTROL OF ILLUMINATION LIGHTING

(71) Applicant: ABL IP HOLDING LLC, Conyers, GA (US)

(72) Inventors: Guan-Bo Lin, Reston, VA (US); David P. Ramer, Reston, VA (US); Januk Aggarwal, Alexandria, VA (US)

(73) Assignee: ABL IP HOLDING LLC, Conyers, GA (US)

(*) Notice: Subject to any disclaimer, the term of this patent is extended or adjusted under 35 U.S.C. 154(b) by 0 days.

(21) Appl. No.: 16/583,980

(22) Filed: Sep. 26, 2019

(51) Int. Cl.
| | |
|---|---|
| *F21V 9/14* | (2006.01) |
| *G02B 5/30* | (2006.01) |
| *G02B 27/28* | (2006.01) |
| *H01L 33/32* | (2010.01) |
| *H01L 33/12* | (2010.01) |
| *F21Y 105/16* | (2016.01) |
| *H01L 33/06* | (2010.01) |
| *F21Y 113/13* | (2016.01) |
| *F21Y 115/30* | (2016.01) |
| *F21W 111/02* | (2006.01) |
| *F21S 8/08* | (2006.01) |

(Continued)

(52) U.S. Cl.
CPC .............. *F21V 9/14* (2013.01); *G02B 5/3016* (2013.01); *G02B 27/286* (2013.01); *H01L 33/12* (2013.01); *H01L 33/32* (2013.01); *F21S 8/085* (2013.01); *F21W 2111/02* (2013.01); *F21Y 2105/16* (2016.08); *F21Y 2113/13* (2016.08); *F21Y 2115/10* (2016.08); *F21Y 2115/20* (2016.08); *F21Y 2115/30* (2016.08); *H01L 33/06* (2013.01)

(58) Field of Classification Search
None
See application file for complete search history.

(56) References Cited

U.S. PATENT DOCUMENTS 9,192,026 B2 * 11/2015 Marquardt ............ H05B 45/10
10,309,588 B2    6/2019 Tyukhova et al.
(Continued)

OTHER PUBLICATIONS

Martin F. Schubert et al., "Linearly polarized emission from GaInN light-emitting diodes with polarization-enhancing reflector," Sep. 3, 2007, vol. 15, No. 18, Optics Express, pp. 11213-11218.
(Continued)

*Primary Examiner* — Britt D Hanley
(74) *Attorney, Agent, or Firm* — RatnerPrestia

(57) ABSTRACT

An example lighting device includes a luminaire having an illumination light source including an illumination light source configured to be driven by electrical power to emit incoming light rays. Luminaire further includes a polarization selective optic coupled to the illumination light source to receive the incoming light rays emitted by the illumination light source and output polarized light rays for illumination lighting. Based on the incoming light rays, the polarization selective optic outputs the polarized light rays including a TM wave. Polarization selective optic steers the TM wave to be outputted to a far field at a grazing angle. Polarization selective optic steers a substantially non-TM wave away from the far field at the grazing angle. Lighting device further includes an illumination light source driver to control a light source operation of the illumination light source.

22 Claims, 14 Drawing Sheets

(51) Int. Cl.
　　　*F21Y 115/20*　　　(2016.01)
　　　*F21Y 115/10*　　　(2016.01)

(56) References Cited

U.S. PATENT DOCUMENTS

| | | | |
|---|---|---|---|
| 10,561,000 B2 * | 2/2020 | Rinko | .................... H05B 45/10 |
| 2014/0265873 A1 | 9/2014 | Marquardt et al. | |
| 2016/0320016 A1 * | 11/2016 | Dedick | .................. F21V 5/007 |

OTHER PUBLICATIONS

Ji Hye Oh et al., "Polarized white light from LEDs using remote-phosphor layer sandwiched between reflective polarizer and light-recycling dichroic filter," Sep. 9, 2013, vol. 21, No. S5, Optics Express, pp. A765-A773.

Jaehee Cho et al., "GaInN-based light emitting diodes embedded with wire grid polarizers," Japanese Journal of Applied Physics 54, 02BB02 (2015), © 2015 The Japan Society of Applied Physics, pp. 02BB02-1-02BB02-5.

World News, Technical advances from around the globe, Metasurface Optics, "Broadband achromatic metalens focuses all polarizations," Laser Focus World, www.laserfocusworld.com, Mar. 2019, 2 pages.

Markus Lindemann et al., "Ultrafast spin-lasers," Nature, vol. 568, Apr. 11, 2019, 20 pages.

* cited by examiner

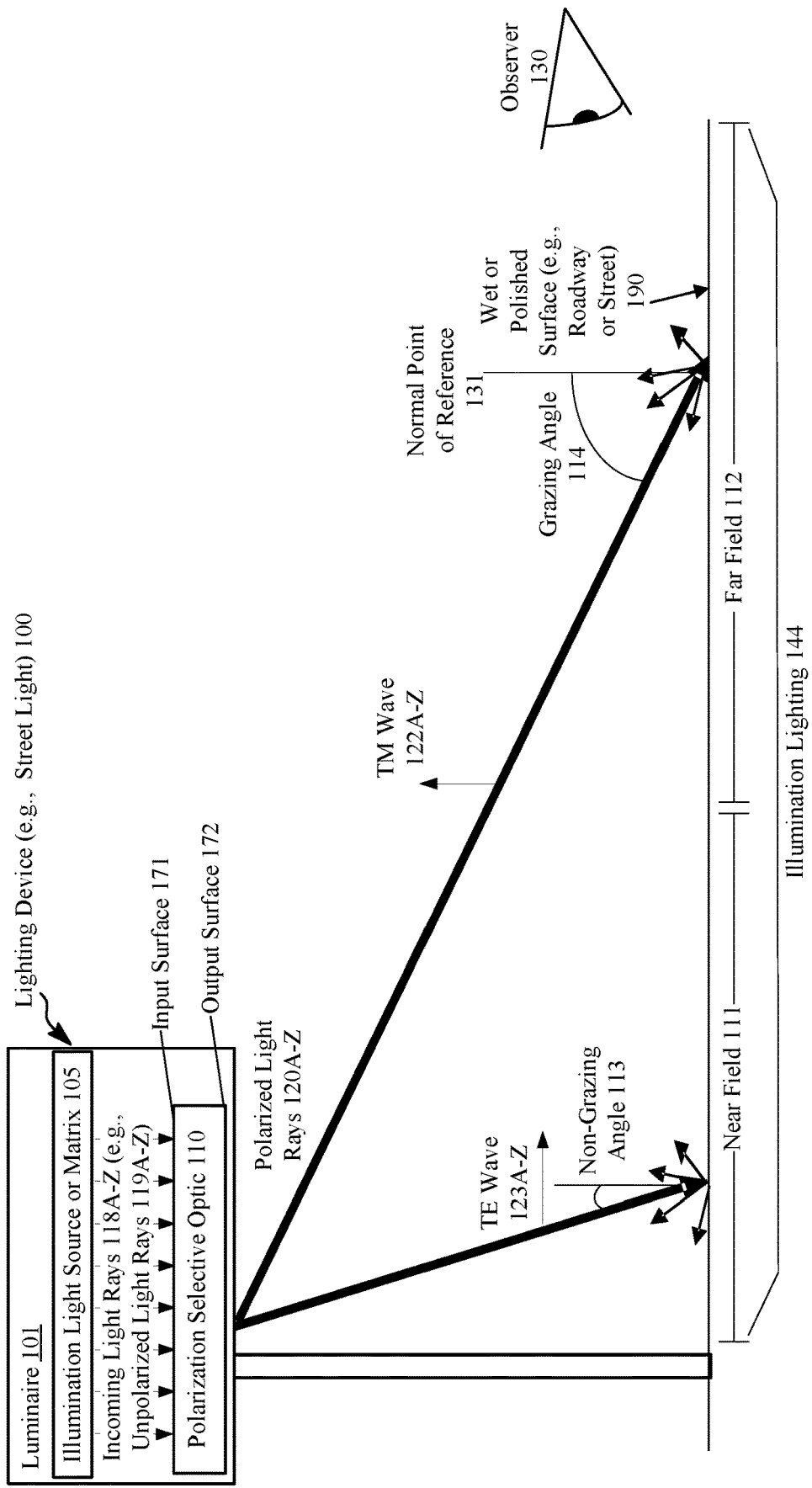

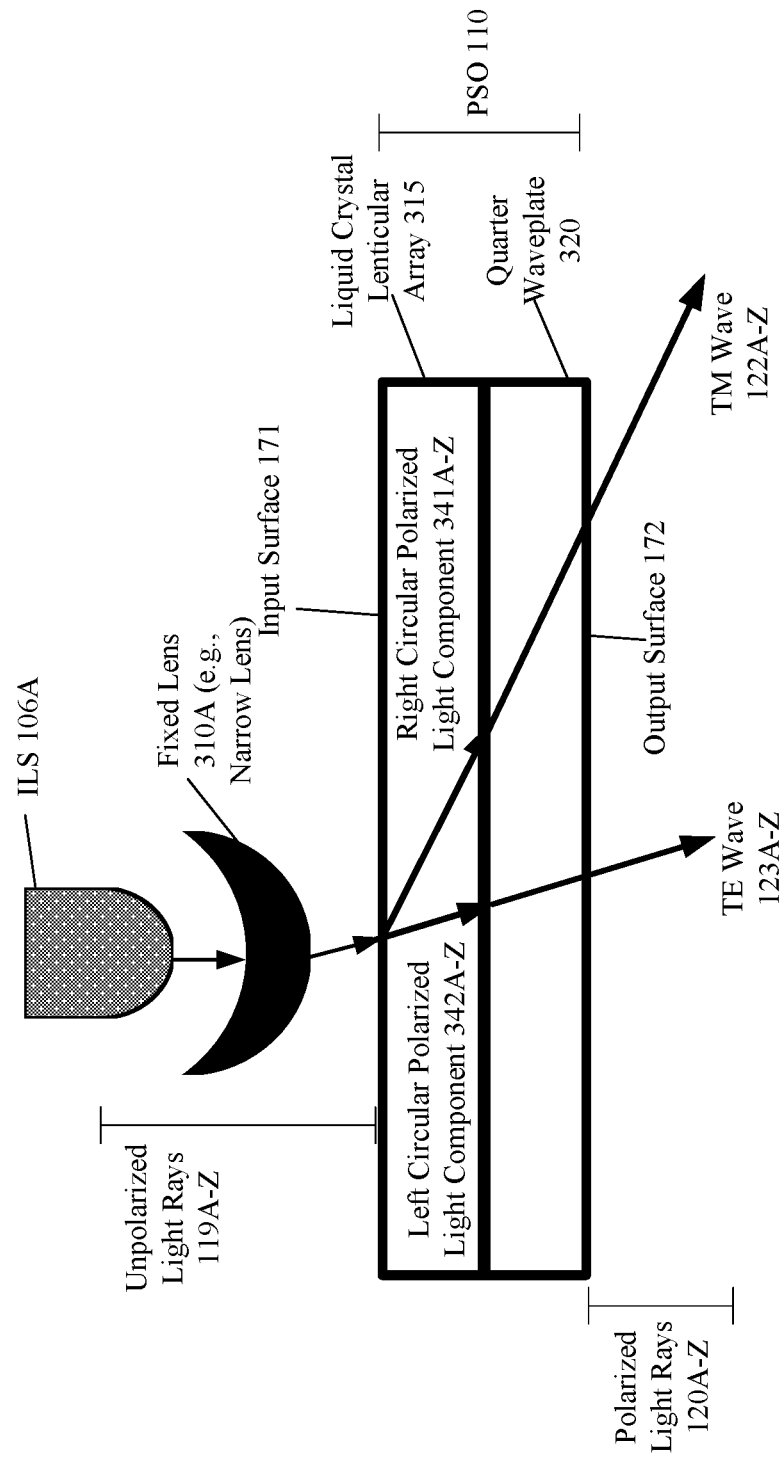

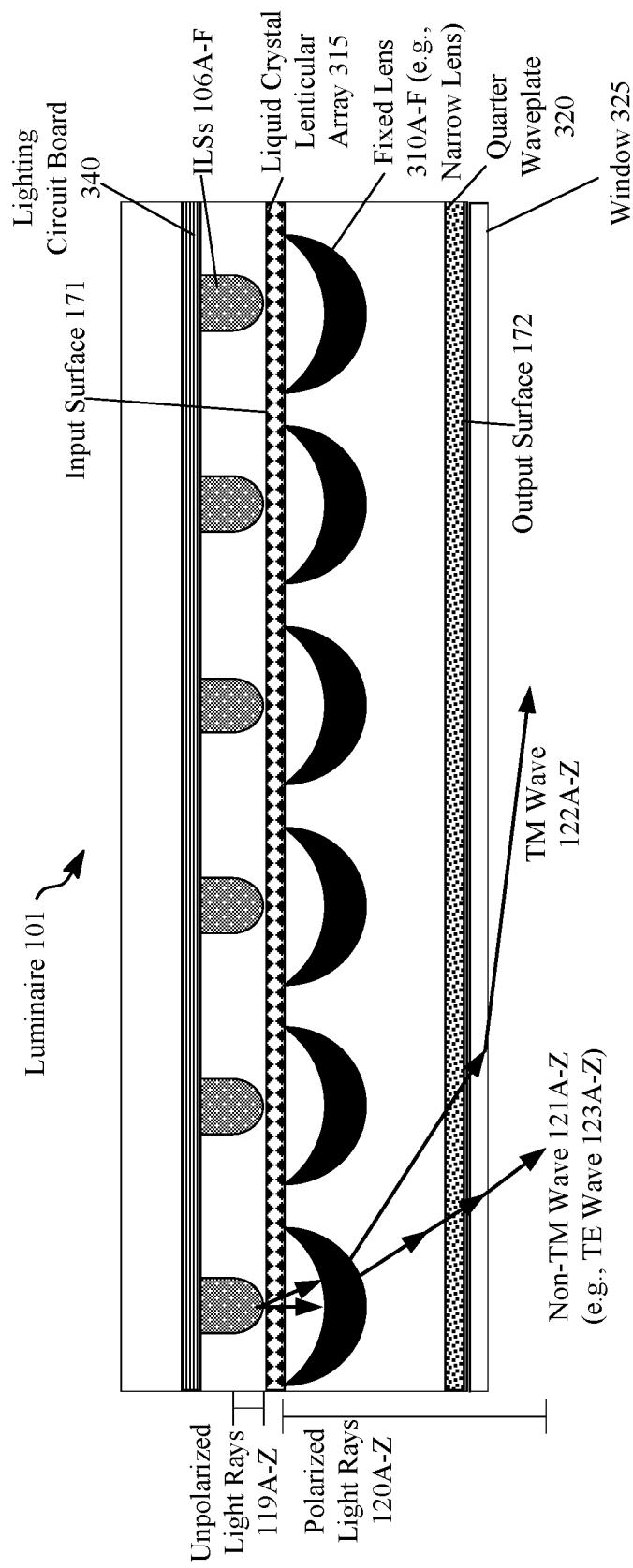

US 10,935,215 B1

POLARIZATION SELECTIVE OPTIC FOR GLARE CONTROL OF ILLUMINATION LIGHTING

TECHNICAL FIELD

The present subject matter relates to a lighting device, e.g., a luminaire for illumination lighting, and a polarization selective optic to control glare of an outputted beam pattern of light based on polarization control, as well as techniques for glare control.

BACKGROUND

Electrically powered artificial lighting for general illumination has become ubiquitous in modern society. Electrical lighting equipment is commonly deployed, for example, in homes, buildings of commercial and other enterprise establishments, as well as in various outdoor settings.

In conventional luminaires, the luminance output can be turned ON/OFF and often can be adjusted up or dimmed down. In some devices, e.g., using multiple colors of light emitting diode (LED) type sources, the user may be able to adjust a combined color output of the resulting illumination. The changes in intensity or color characteristic of the illumination may be responsive to manual user inputs or responsive to various sensed conditions in or about the illuminated space.

Some luminaires, such as streetlights and hallway lights, output illumination lighting with a limited field of view at or around one beam angle. When unpolarized light strikes a wet surface (e.g., a road after rainfall) or a polished surface at a high angle between the unpolarized light and the surface, a strong Fresnel reflection is created, which can cause glare. Glare is a visual condition in which there is excessive contrast or an inappropriate distribution of light sources that disturbs the observer or limits the ability to distinguish details, for example, of objects (e.g., passing vehicles on a roadway).

In the less severe scenario, the glare can be visually objectionable (e.g., discomforting) to the observer. In the more severe scenario, the glare can be visually disabling to an observer, which can be dangerous in some scenarios, for example, when the observer for example is a driver of a vehicle in streetlight applications.

BRIEF DESCRIPTION OF THE DRAWINGS

The drawing figures depict one or more implementations, by way of example only, not by way of limitations. In the figures, like reference numerals refer to the same or similar elements.

FIG. 1B illustrates the lighting device of FIG. 1A, in an operational configuration in which the polarization selective optic outputs a transversely magnetic (TM) wave to a far field and a transversely electric (TE) wave to a near field.

FIG. 3C is another zoomed in view of the boxed detail area A of FIG. 3A and shows additional details of a second conversion example of unpolarized light rays into polarized light rays by the polarization selection optic including the liquid crystal lenticular array and the quarter waveplate.

FIG. 3D is another enlarged view of a section of the luminaire of the lighting device of FIGS. 1A-B and 2, corresponding to the dashed circle A-A in FIG. 2, in which a fixed lens is located between the liquid crystal lenticular array and the quarter waveplate of the polarization selective optic.

DETAILED DESCRIPTION

Figure 1A:
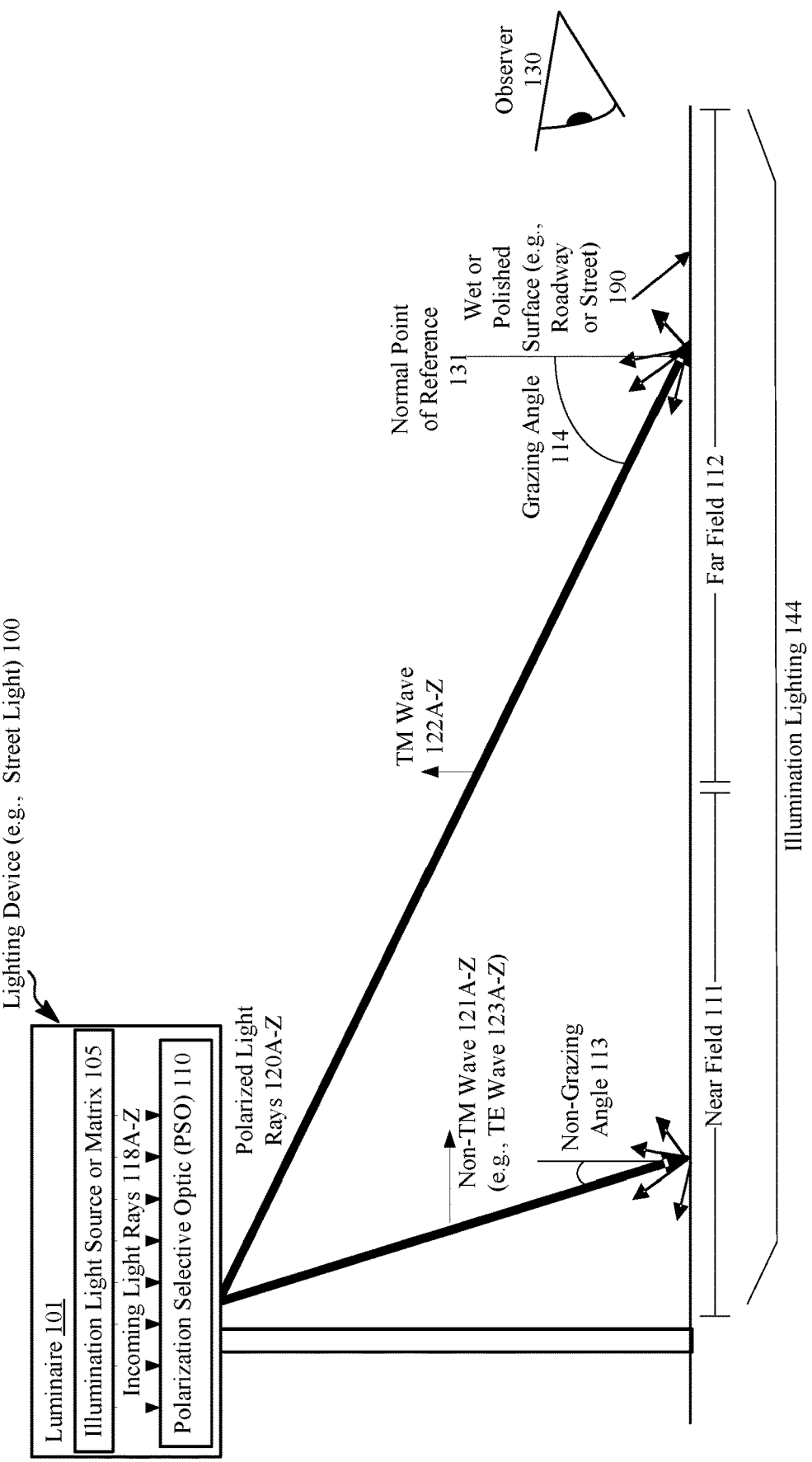
FIG. 1A is a simplified functional block diagram of a lighting device, including a luminaire (e.g., a street light), which includes an illumination light source (ILS) matrix and a polarization selective optic (PSO) to control glare.

A lighting device includes a luminaire with illumination light sources and a polarization selective optic for roadway, street, outdoor, downlight, indoor, or industrial applications. Specific applications of the luminaire with the polarization selective optic can include illumination lighting for a hallway, under cabinet, cove/indirect, sign, artwork, countertop, stoplights, outdoor light, canopy, wall-pack, area, or street light. In addition, other applications of the lighting device that includes the polarization selective optic to control glare can include enhancing glare to impede criminals, improve visibility in counter-flow, or improve detectability of water (e.g., highlight puddles).

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The term "luminaire," as used herein, is intended to encompass essentially any type of device that processes energy to generate or supply artificial light, for example, for general illumination of a space intended for use of occupancy or observation, typically by a living organism that can take advantage of or be affected in some desired manner by the light emitted from the device. However, a luminaire may provide light for use by automated equipment, such as sensors/monitors, robots, etc. that may occupy or observe the illuminated space, instead of or in addition to light provided for an organism. However, it is also possible that one or more luminaires in or on a particular premises have other lighting purposes, such as signage for an entrance or to indicate an exit. In most examples, the luminaire(s) illuminate a space or area of a premises including a surface to a level useful for a human in or passing through the space, e.g., of sufficient intensity for general illumination of a room or corridor in a building or of an outdoor space such as a street, sidewalk, parking lot or performance venue. The actual source of illumination light in or supplying the light for a luminaire may be any type of artificial light emitting device, several examples of which are included in the discussions below.

Terms such as "artificial lighting" or "illumination lighting" as used herein, are intended to encompass essentially any type of lighting that a device produces light by processing of electrical power to generate the light. A luminaire for an artificial lighting or illumination lighting application, for example, may take the form of a lamp, light fixture, or other luminaire arrangement that incorporates a suitable light source, where the lighting device component or source(s) by itself contains no intelligence or communication capability. The illumination light output of an artificial illumination type luminaire, for example, may have an intensity and/or other characteristic(s) that satisfy an industry acceptable performance standard for a general lighting application.

The term "coupled" as used herein refers to any logical, optical, physical or electrical connection, link or the like by which signals or light produced or supplied by one system element are imparted to another coupled element. Unless described otherwise, coupled elements or devices are not necessarily directly connected to one another and may be separated by intermediate components, elements or communication media that may modify, manipulate or carry the light or signals.

Light output from the luminaire may carry information, such as a code (e.g. to identify the luminaire or its location) or downstream transmission of communication signaling and/or user data. The light based data transmission may involve modulation or otherwise adjusting parameters (e.g. intensity, color characteristic or distribution) of the illumination light output from the luminaire.

The orientations of the lighting device, luminaire, associated components and/or any complete devices incorporating the polarization selective optic and illumination light sources, such as shown in any of the drawings, are given by way of example only, for illustration and discussion purposes. In operation for a particular optical processing application, the luminaire and/or the included polarization selective optic and illumination light sources may be oriented in any other direction suitable to the particular application of the lighting device, for example up light or side light or any other orientation. Also, to the extent used herein, any directional term, such as lateral, longitudinal, left, right, up, down, upper, lower, top, bottom, and side, are used by way of example only, and are not limiting as to direction or orientation of any optic or component of an optic constructed as otherwise described herein.

Reference now is made in detail to the examples illustrated in the accompanying drawings and discussed below.

FIG. 1A is a simplified functional block diagram of a lighting device 100, including a luminaire (e.g., a street light) 101, which includes an illumination light source (ILS) matrix 105 and a polarization selective optic (PSO) 110 to control glare. Generally, the illumination light source matrix 105 includes at least one illumination light source 106A (see FIG. 2) configured to be driven by electrical power to emit incoming light rays 118A-Z. Lighting device 100 further includes an illumination light source driver (element 613 of FIG. 6) to control a light source operation of the at least one illumination light source 106A.

Luminaire 101 further includes a polarization selective optic 110 coupled to the illumination light source 106A to receive the incoming light rays 118A-Z emitted by the illumination light source 106A and output polarized light rays 120A-Z for illumination lighting 144. Based on the incoming light rays 118A-Z, the polarization selective optic 110 outputs the polarized light rays 120A-Z including a TM wave 122A-Z. The polarization selective optic 110 steers the TM wave 122A-Z to be outputted to a far field 112 at a grazing angle 114. Unlike a substantially non-TM wave 121A-Z (e.g., TE wave 123A-Z), the TM wave 122A-Z when steered to the far field 112 does not cause glare to appear to the observer 130. The term "substantially non-TM wave" means that 90% or more of the luminous flux of that component is in a non-TM polarization state. Hence, the polarization selective optic 110 steers a substantially non-TM wave 121A-Z away from the far field 112 at the grazing angle 114, for example, to the near field 111 at the non-grazing angle 113. In some examples, steering the substantially non-TM wave 121A-Z away from the far field 112 means that polarization selective optic 110 does not output a substantially non-TM wave 121A-Z, as described in the examples of FIGS. 1C and 5A-B.

As used herein, a TM wave is a transversely magnetic wave where the magnetic field is always perpendicular to the plane of incidence. The TM wave is referred to as p-polarized light; p stands for parallel; the electric field is always parallel in the plane of incidence; the plane of incidence is where the incident ray and the reflective ray co-exist. The reflection of the TM wave is usually smaller for different incident angles. Therefore, if the light from the luminaire 101 is purely a TM wave, most of the reflection glare can be largely reduced. As used herein, a TE wave is a transversely electric wave where the electric field is always perpendicular to the plane of incidence. The TE wave is referred to as s-polarized light; s stands for senkrecht (perpendicular in Germany); the electric field is always perpendicular to the plane of incidence. The term vertical polarized light component can be used to refer to the TM wave and the term horizontal polarized light component can be used to refer to the TE wave; however, this depends on the object that causes reflection, e.g., a hood of a car or windshield glass of the car. Thus, the terms TM wave and the TE wave are intended to be more precise.

The near field 111 is a close-in region to the luminaire 101 that is situated relatively closer in distance (nearer in space) to the luminaire 101 compared to the far field 112. For example, the near field 111 includes portions of a wet or polished surface 190 (e.g., street) that are directly underneath the luminaire 101 that would not cause glare if struck by the substantially non-TM wave 121A-Z. The far field 112 is a far-out region to the luminaire that is situated relatively more distant (farther in space) to the luminaire 101 compared to the near field 111. For example, the far field 112 includes portions of the wet or polished surface 190 that are not directly underneath the luminaire 101 that would cause glare if struck by the substantially non-TM wave 121A-Z.

The grazing angle 114 is a high angle as measured by a point of reference 131 that is normal (orthogonal) to the wet or polished surface 190 (e.g., a roadway or street). When the TM wave 122A-Z strikes the wet or polished surface 190 at the grazing angle 114, the TM wave 122A-Z creates a much weaker Fresnel reflection, which results in less glare for an eye of the observer 130 (e.g., human operator driving a vehicle). The non-grazing angle 113 is a low angle as measured from the point of reference 131 that is normal (orthogonal) to the wet or polished surface 190. When the substantially non-TM wave 121A-Z (e.g., TE wave 123A-Z) or the unpolarized light rays 119A-Z strike the wet or polished surface 190 at the non-grazing angle 113, the TM wave 122A-Z creates a weak Fresnel reflection and does not cause glare for the eye of the observer 130. Utilizing this technique, glare control is achieved.

Selecting the dividing line between the non-grazing angle 113 and the grazing angle 114 is application specific depending on the glare tolerance for that application, but generally the non-grazing angle 113 and the grazing angle 114 divided by angle value in the range of approximately 21-65°. In a first example, the non-grazing angle 113 is approximately 0-20° and the grazing angle 114 is approximately 21-90°. In a second example, the non-grazing angle 113 is approximately 0-45° and the grazing angle 114 is approximately 46-90°. In a third example, the non-grazing angle 113 is approximately 0-65° and the grazing angle 114 is approximately 66-90°. Based on Fresnel's equations for water and air, there will be a lower vertical Fresnel reflection as compared to a horizontal Fresnel reflection over the entire range of angles, where the angle is measured from the point of reference 131 that is normal to the wet or polished surface 190.

Figure 1C:
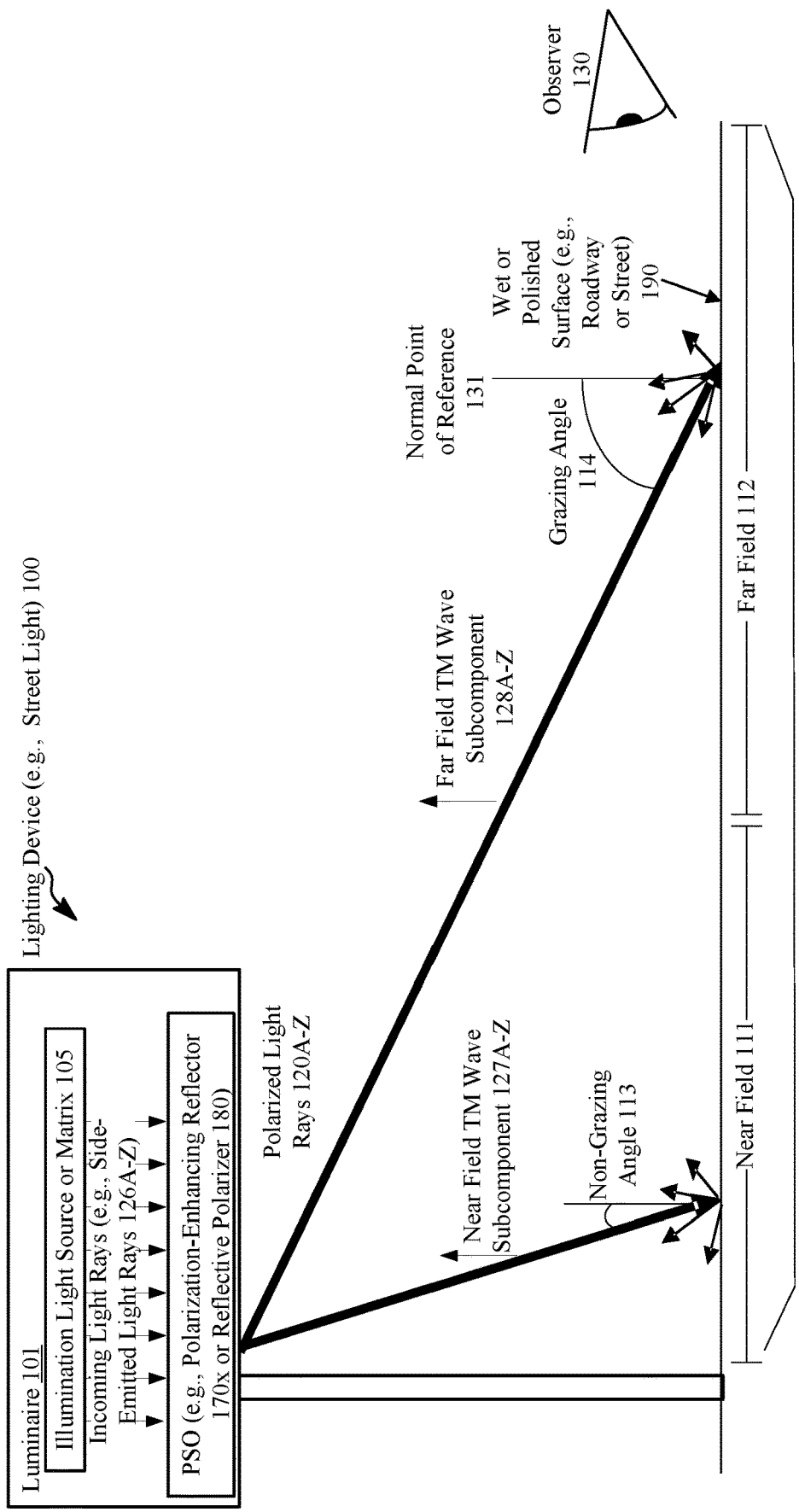
FIG. 1C illustrates the lighting device of FIG. 1A, in an operational configuration in which the polarization selective optic outputs a far field TM wave subcomponent to the far field and a near field TM wave subcomponent to the near field.

One way to control glare in the luminaire 101 is to include a polarization selective optic 110 that includes a transmissive polarizer (e.g., dichroic polarizer), which only emits polarized light rays 120A-Z consisting of the TM wave 122A-Z, and absorbs the remaining light. However, a polarization selective optic 110 that includes a transmissive polarizer creates a luminaire 101 with an optical loss of approximately 50%. This is because half of the incoming light rays 118A-Z with an unwanted polarization state are blocked (i.e., absorbed) by the transmissive polarizer. To improve optical efficiency, the polarization selective optic 110 can include: (i) a liquid crystal lenticular array 315 and a quarter waveplate 320 (FIGS. 1B and 3A-E); (ii) a polarizing meta-lens 414 (FIGS. 1B and 4A-B); (iii) a polarization-enhancing reflector (FIGS. 1C and 5A); or (iv) a reflective polarizer (FIGS. 1C and 5B). Glare is controlled utilizing these four different types of a polarization selective optic(s) 110 while attaining a high optical efficiency as outlined in more detail below.

FIG. 1B is another simplified functional block diagram of the lighting device 100 of FIG. 1A, in which the polarization selective optic 110 outputs a TM wave 122A-Z to the far field 112 and a TE wave 123A-Z to the near field 111. To prevent the 50% loss of optical efficiency created by a transmissive polarizer type of polarization selective optic 110, FIG. 1B illustrates a first approach to the polarization selective optic 110. This first approach converts (e.g., transforms) incoming light rays 118A-Z that include unpolarized light rays 119A-Z entering an input surface 171 of the polarization selective optic 110 into polarized light rays 120A-Z that exit an output surface 172 of the polarization selective optic 110. The polarized light rays 120A-Z include a TM wave 122A-Z and a TE wave 123A-Z. Polarization selective optic 110 directs the TM wave 122A-Z and the TE wave 123A-Z into different areas (i.e., near field 111 and far field 112) of the wet or polished surface 190 based on polarization state. In FIG. 1B, the polarization selective optic 110 includes a liquid crystal lenticular array 315 and a quarter waveplate 320 as shown in detail in FIGS. 3A-E. Alternatively, in FIG. 1B, the polarization selective optic 110 includes a polarizing meta-lens 414 as shown in detail in FIGS. 4A-B.

FIG. 1C is another simplified functional block diagram of the lighting device 100 of FIG. 1A, in which the polarization selective optic 110 outputs a far field TM wave subcomponent 128A-Z to the far field 112 and a near field TM wave subcomponent 127A-Z to the near field 111. To prevent the 50% loss of optical efficiency created by a transmissive polarizer type of polarization selective optic 110, FIG. 1C illustrates a second approach to the polarization selective optic 110. This second approach reflects or rotates incoming light rays 118A-Z that include side-emitted light rays 126A-Z. The side-emitted light rays 126A-Z are emitted from side facets 511A-Z of the illumination light source matrix 106A. In FIG. 1C, the polarization selective optic 110 includes a respective polarization-enhancing reflector 170A-F for each respective illumination light source 106A-F as shown in detail in FIG. 5A. Alternatively, in FIG. 1C, the polarization selective optic 110 includes a reflective polarizer 180 as shown in detail in FIG. 5B. Polarized LEDs, polarized lasers, or meta-emitters can be utilized in this approach.

Figure 2:
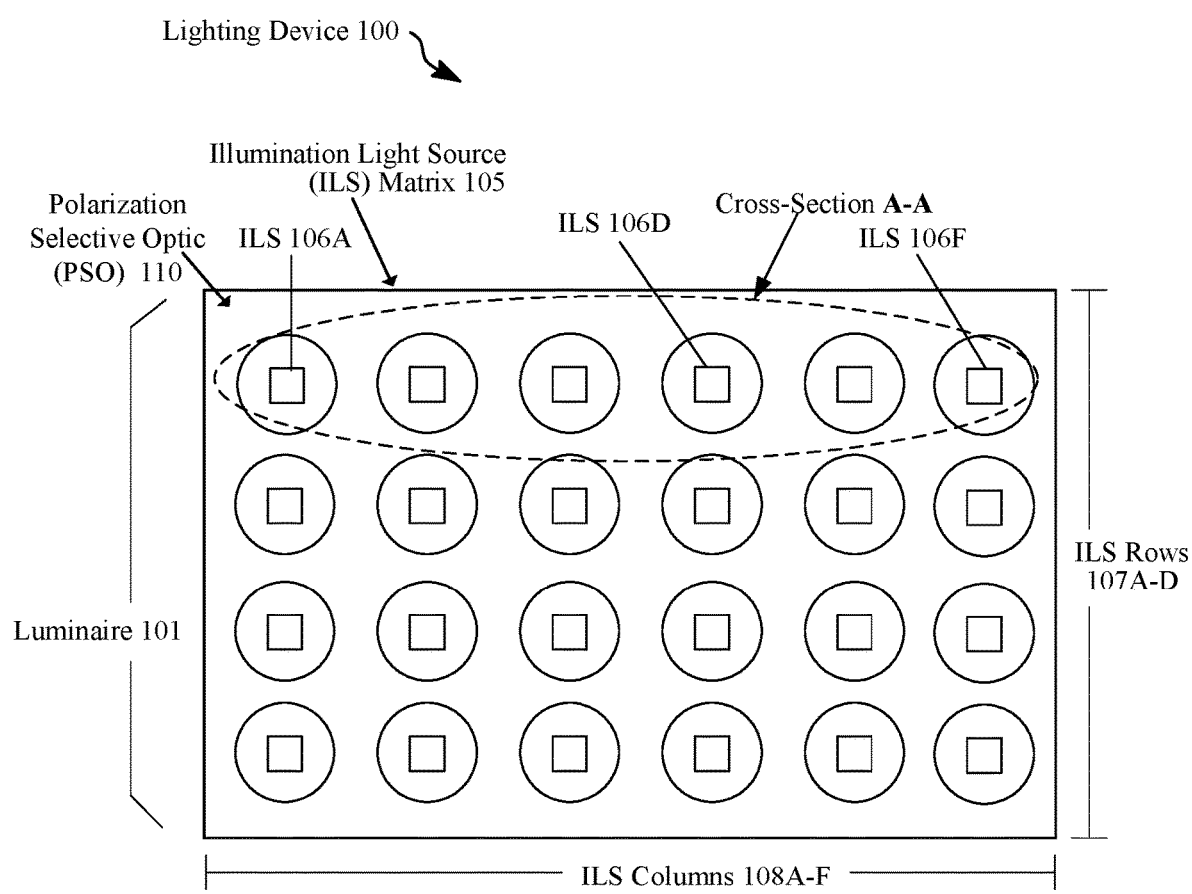
FIG. 2 is a top view of the illumination light source matrix with multiple illumination light sources and the polarization selective optic of the lighting device of FIGS. 1A-C.

FIG. 2 is a top view of the lighting device 100 of FIGS. 1A-C, including the luminaire 101 having the illumination light source matrix 105 with multiple illumination light sources 106A-X and the polarization selective optic 110. The luminaire 101 includes the illumination light source matrix 105 and an illumination light source driver 613 (see FIG. 6) coupled to the luminaire 101 to control a light source operation. The illumination light sources 106x may be virtually any type of light source suitable to providing the intended type of light output that may be electronically controlled. The illumination light sources, for example, may provide visible light output as providing visible illumination for human occupancy or the like and/or visible light source based positioning. The illumination light sources 106x may be of the same general type in the luminaire 101, e.g. all formed by some number of light emitting diodes (LEDs); although in many installations, some numbers of the luminaires 101 may have different types of light sources 106x, e.g. some use LEDs, some use compact or tube type fluorescent sources, etc. Thus, the illumination light sources 106x can include one or more organic light emitting diodes (OLEDs); one or more micro LEDs; one or more nanorod or nanowire LEDs; at least one fluorescent lamp; or at least one halogen lamp. In some examples, the polarization selective optic 110 can be utilized to steer or shape outputted light from optical fiber instead of illumination light sources 106A-X. In an example, illumination light sources 106x include a number of layers forming one or more actual OLEDs (e.g., a stack including multiple emissive, anode, cathode, and transport layers).

The illumination light sources 106x may use a single emitter to generate light or may combine light from some number of emitters that generate the light. A lamp or "light bulb" is an example of a single source. An LED light engine may use a single output for a single source but typically combines light from multiple LED type emitters within the single light engine. Many types of light sources provide an illumination light output that generally appears uniform to an observer 130, although there may be some color or intensity striations, e.g. along an edge of a combined light output. For purposes of the present examples, however, the appearance of the light source output may not be strictly uniform across the output area or aperture of the source. For example, although the source may use individual emitters or groups of individual emitters to produce the light generated by the overall source; depending on the arrangement of the emitters, the light output may not be relatively uniform across the aperture or may appear pixelated to an observer 130 viewing the output aperture (window 325) due to glare control. The individual emitters or groups of emitters may be separately controllable, for example to control intensity or color characteristics of the source output. As such, the illumination light source 106x may or may not be pixelated for control purposes. To achieve glare control, the polarization selective optic 110 is calibrated to selectively control the polarization of the emerging outputted beam pattern 430 for illumination lighting 144 from the luminaire 101 (e.g., see FIG. 3B). The polarization selective optic 110 may support controlled beam steering, controlled beam shaping or a combination of controlled beam steering and shaping.

In the examples herein, the luminaire 101 includes at least one or more components forming the illumination light sources 106x for generating the artificial illumination lighting 144. In several illustrated examples, the luminaire 101 may take the form of a light fixture, such as a street light, pendant or drop light or a downlight, or wall wash light or the like. For example, luminaire 101 includes a pendant down light suspended/hanging from the ceiling, a 2×4 feet light fixture flush mounted on the ceiling, or sconces hung on the wall. Other fixture mounting arrangements are possible. For example, at least some implementations of the luminaire 101 may be surface mounted on or recess mounted in a wall, ceiling or floor. Orientation of the luminaire 101 and components thereof are shown in the drawings and described below by way of non-limiting examples only. The luminaire 101 may take other forms, such as lamps (e.g. table or floor lamps or street lamps) or the like. Additional devices, such as fixed or controllable optical elements, may be included in the luminaire 101, e.g. to selectively distribute light from the illumination light sources 106x.

As further shown in FIG. 2, the illumination light sources 106A-X can be arranged in a first series of linear illumination light source rows 107A-D and a second series of linear illumination light source columns 108A-F. The number of illumination light sources 106A-X in the lighting device 100 can be more or less than that shown. Only 24 illumination light sources 106A-X arranged as an array in four illumination light source rows 107A-D and six columns 108A-F are shown in FIG. 2. However, it should be understood that many hundreds or thousands of illumination light source rows 107x and columns 108x that can be arranged in any number of rows and columns, or other matrix formations (e.g., circular, oval, or any pentagon shape or other distributions, such as non-periodic), to form the illumination light source matrix 105 and the polarization selective optic 110 of the luminaire 101.

Figure 3A:
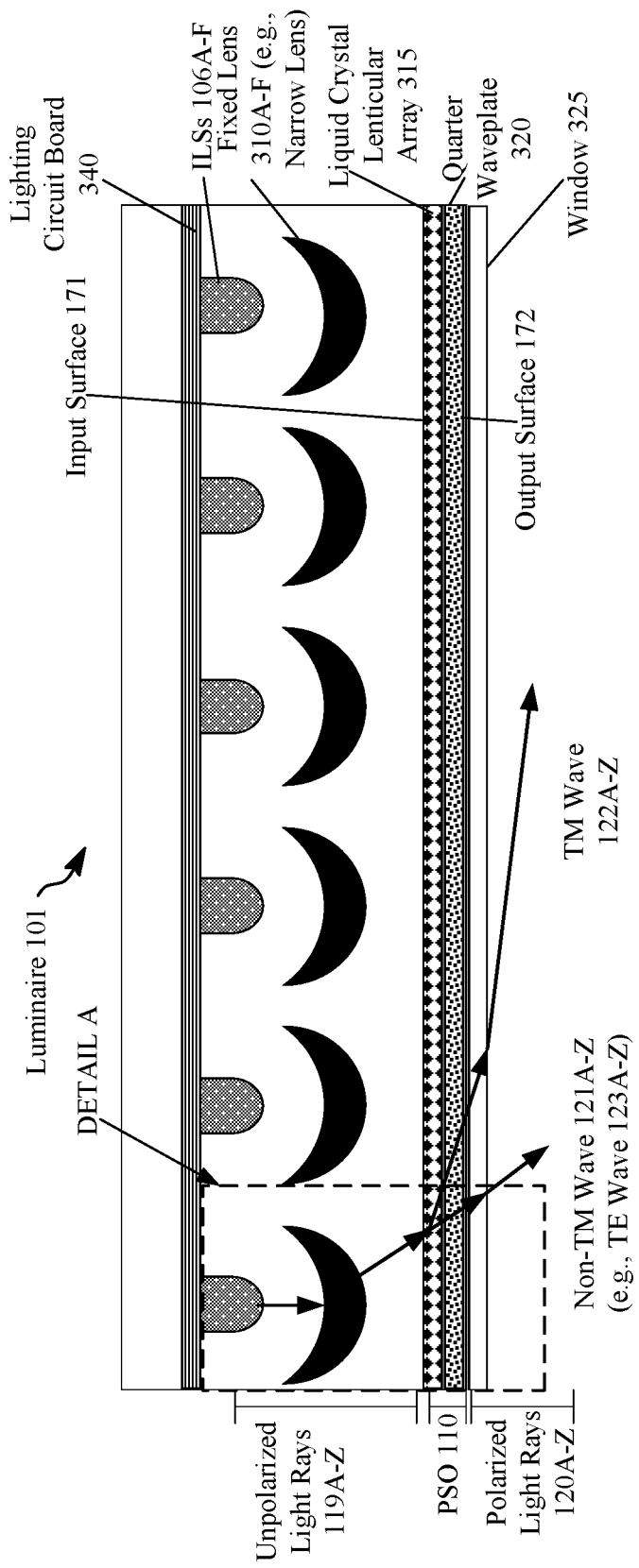
FIG. 3A is an enlarged view of a section of the luminaire of the lighting device of FIGS. 1A-B and 2, corresponding to the dashed circle A-A in FIG. 2, showing six of the illumination light sources and the polarization selection optic including a liquid crystal lenticular array and a quarter waveplate.
Figure 4A:
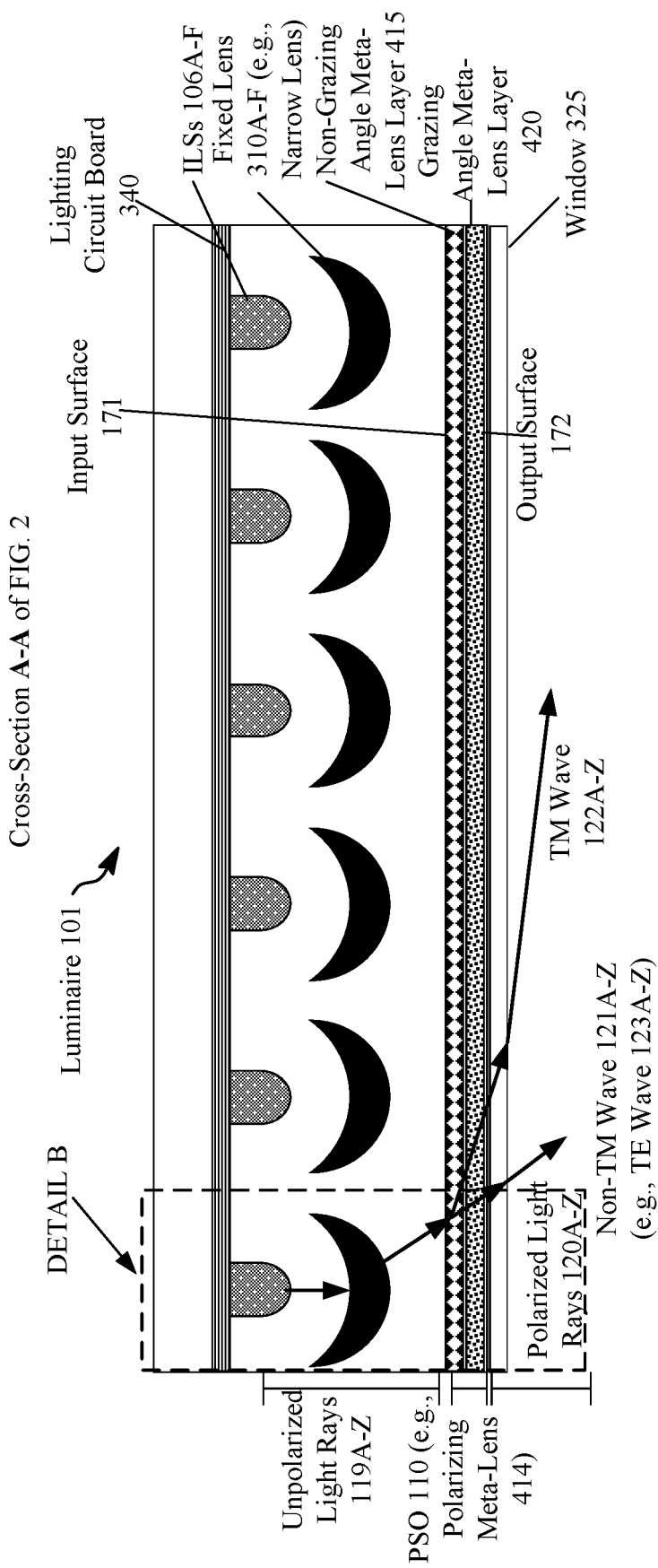
FIG. 4A is an enlarged view of a section of another alternate implementation of the luminaire of the lighting device of FIGS. 1A-B and 2, corresponding to the dashed circle A-A in FIG. 2, showing six of the illumination light sources and a polarization selection optic including a polarizing meta-lens.
Figure 4B:
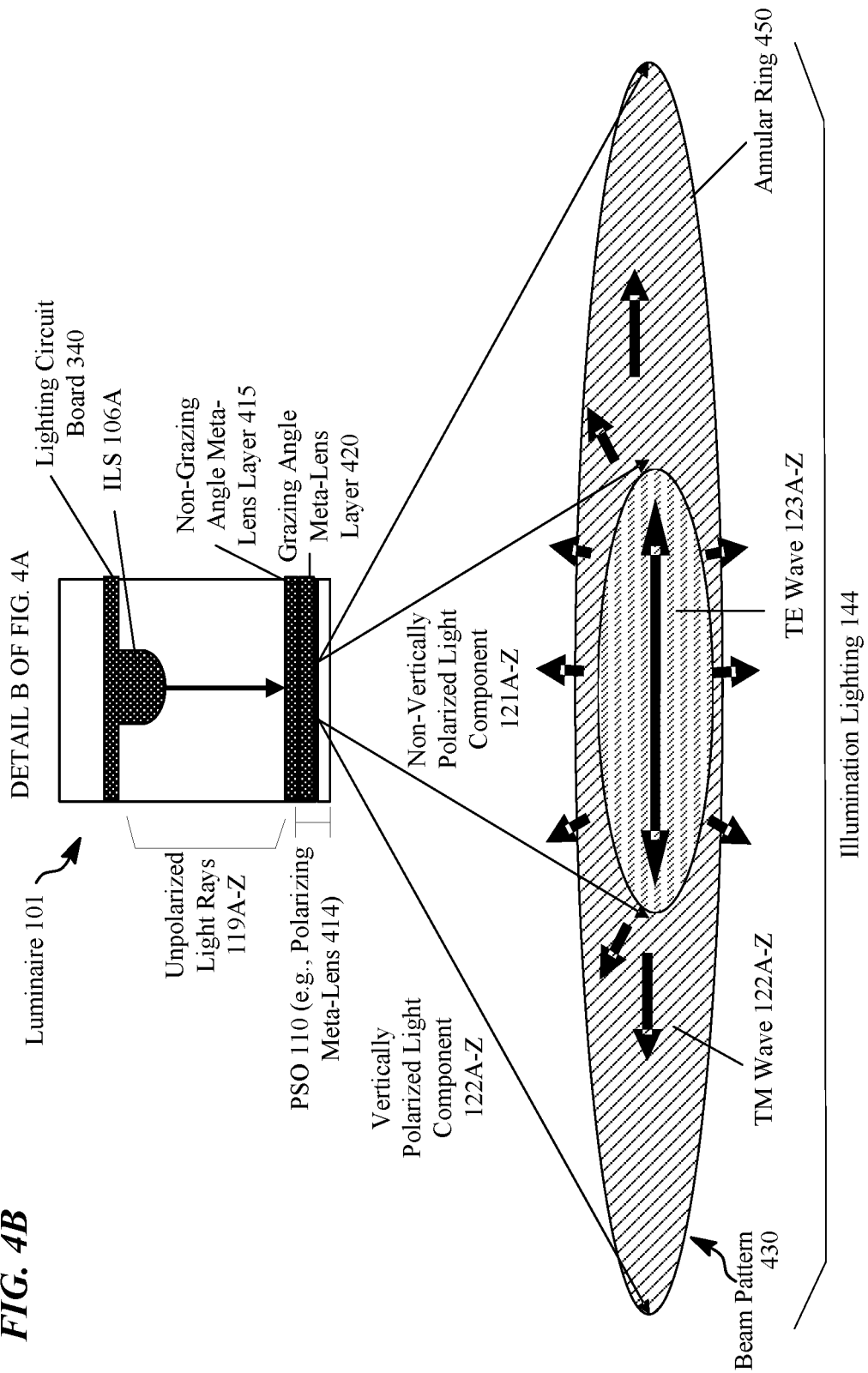
FIG. 4B is a zoomed in view of the boxed detail area B of FIG. 4A and shows additional details of a third conversion example of unpolarized light rays into polarized light rays by the polarization selection optic including the polarizing meta-lens.

FIG. 3A is an enlarged view of a section of the luminaire 101 of the lighting device 100 of FIGS. 1A-B and 2, corresponding to the dashed circle A-A in FIG. 2, showing six of the illumination light sources 106A-F and the polarization selection optic 110. Polarization selection optic 110 includes a liquid crystal lenticular array 315 and a quarter waveplate 320. The luminaire 101 also includes a window 325, which is a light transparent cover; however, the window 325 may not be included. As shown in FIG. 3A, illumination light sources 106A-F (e.g., LEDs) are arranged in an array on a lighting circuit board 340. As further shown, a respective fixed lens 310A-F is coupled to a respective illumination light source 106A-F, where each fixed lens 310A-F has a standard index of curvature (e.g., spherical or aspherical) of a non-imaging lens that is tuned to not have a wide field of view and thus not cause glare.

Fixed lens is 310A-F is a non-polarization sensitive lens, such as a narrow lens to narrow the unpolarized light rays 119A-Z. Alternatively, fixed lens 310A-F can be a wide lens to broaden the unpolarized light rays 119A-Z. In the examples, each fixed lens 310A-F is a narrow lens and the PSO 110 is a second lens that produces an even narrower field of view than the fixed lens 310A-F. In some examples, however, each fixed lens 310A-F can be wide lens to widen the unpolarized light rays 119A-Z and the PSO 110 then narrows the unpolarized light rays 119A-Z.

Returning to the example, the polarization selective optic 110 behaves as a second narrow lens that produces an even narrower field of view than the fixed narrowlens 310A-F. Polarization selective optic 110 only diverges the TM wave 122A-Z, which makes the fixed lens 310AF appear to act more strongly. Examples of illumination light sources 106A-F include various light emitters, although the emitted light may be in the visible spectrum or in other wavelength ranges. Suitable light generation sources for use as the illumination light sources 106A-F include various conventional lamps, such as incandescent, fluorescent or halide lamps; one or more light emitting diodes (LEDs) of various types, such as planar LEDs, micro LEDs, micro organic LEDs, LEDs on gallium nitride (GaN) substrates, micro nanowire or nanorod LEDs, photo pumped quantum dot (QD) LEDs, micro plasmonic LED, micro resonant-cavity (RC) LEDs, and micro photonic crystal LEDs; as well as other sources such as micro super luminescent Diodes (SLD) and micro laser diodes. Of course, these light generation technologies are given by way of non-limiting examples, and other light generation technologies may be used to implement the illumination light sources 106A-F. For example, it should be understood that non-micro versions of the foregoing light generation sources can be used Referring now to both FIGS. 3A-E and 4A-B, which correspond to FIG. 1B, the polarization selective optic 110 includes: (i) a liquid crystal lenticular array 315 and a quarter waveplate 320, or (ii) a polarizing meta-lens 414. The incoming light rays 118A-Z include unpolarized light rays 119A-Z. The polarization selective optic 110 includes an input surface 171 coupled to receive the unpolarized light rays 119A-Z emitted by the illumination light source 106A and an output surface 172 to output the polarized output light rays 120A-Z for the illumination lighting 144. The polarization selective optic 110 converts the unpolarized light rays 119A-Z into the polarized light rays 120A-Z including the TM wave 122A-Z. The polarization selective optic 110 steers the TM wave 122A-Z through the output surface 172 to be outputted to the far field 112 at the grazing angle 114. The polarized light rays 120A-Z further include a TE wave 123A-Z. The polarization selective optic 110 steers the TE wave 123A-Z through the output surface 172 to be outputted to a near field 111 at a non-grazing angle 113.

Referring more specifically to FIGS. 3A-E, the polarization selective optic 110 includes a liquid crystal lenticular array 315 and the quarter waveplate 320. Liquid crystal lenticular array 315 can be a non-switchable polymerized liquid crystal lenticular array that is microscopically in a liquid state and macroscopically in a solid state. Examples of a non-switchable polymerized liquid crystal lenticular array is disclosed in U.S. Pat. No. 7,859,640, issued Dec. 28, 2010, titled "Method and Apparatus for Spatially Modulated Electric Field Generation and Electro-Optical Tuning Using Liquid Crystals," which is incorporated by reference as if fully set forth herein. The liquid crystal lenticular array 315, however, does not have to be cured, for example, the liquid crystal lenticular array 315 can be electrically switchable and once switched left in that state permanently or actively controlled.

Quarter waveplate 320 or retarder is an optical device that alters the polarization state of a light wave travelling through it. The quarter waveplate 320 converts linearly polarized light into circularly polarized light and vice versa and can be used to produce elliptical polarization as well. The quarter waveplate 320 is constructed out of a birefringent material (such as quartz or mica), for which the index of refraction is different for light linearly polarized along one or the other of two certain perpendicular crystal axes. The behavior of a quarter waveplate 320 depends on the thickness of the crystal, the wavelength of light, and the variation of the index of refraction. By appropriate choice of the relationship between these parameters, quarter waveplate 320 introduces a controlled phase shift between the two polarization components of the light.

Liquid crystal lenticular array 315 is set up to convert the unpolarized light rays 119A-Z into right and left circular polarized light components 341A-Z, 342A-Z. The liquid crystal lenticular array 315 behaves as a Bragg polarizing lens that splits the unpolarized light rays 119A-Z into right and left circular polarized light components 341A-Z, 342A-Z and directs the right and left circular polarized light 341A-Z, 342A-Z into different directions. For a street light type of luminaire 101, the liquid crystal lenticular array 315 can redirect the left circular polarized light component 342A-Z to the grazing angle 114 and the right circular polarized light 341A-Z can be unaffected and continue its path to the non-grazing angle 113. The right and left circular polarized light components 341A-Z, 342A-Z are passed through a quarter waveplate 320 and converted (e.g., transformed) into a TE wave 123A-Z and a TM wave 122A-Z by the quarter waveplate 320. The TE wave 123A-Z is directed down to low angle areas where there is no high angle glare to the observer 130. The TM wave 122A-Z can be directed to high angle areas where the TE wave 123A-Z would otherwise debilitating to the observer 130.

Selection of which of the right or left circular polarized light 341A-Z, 342A-Z is converted into the TM wave 122A-Z and the TE wave 123A-Z is arbitrary. This conversion can be done in both directions by the quarter waveplate 320. The liquid crystal lenticular array 315 only needs to be paired up with the quarter waveplate 320 in the correct configuration to produce the desired output polarizations.

Accordingly, the liquid crystal lenticular array 315 converts the unpolarized light rays 119A-Z into a right circular polarized light component 341A-Z and a left circular polarized light component 342A-Z. The polarization selective optic 110 further includes a quarter waveplate 320 coupled to the liquid crystal lenticular array 315 to: (i) convert the right circular polarized light component 341A-Z into the TE wave 123A-Z and the left circular polarized light component 342A-Z into the TM wave 122A-Z or vice versa, (ii) steer the TE wave 123A-Z to the near field 111 at the non-grazing angle 113, and (iii) only steer the TM wave 122A-Z to the far field 112 at the grazing angle 114.

Figure 3B:
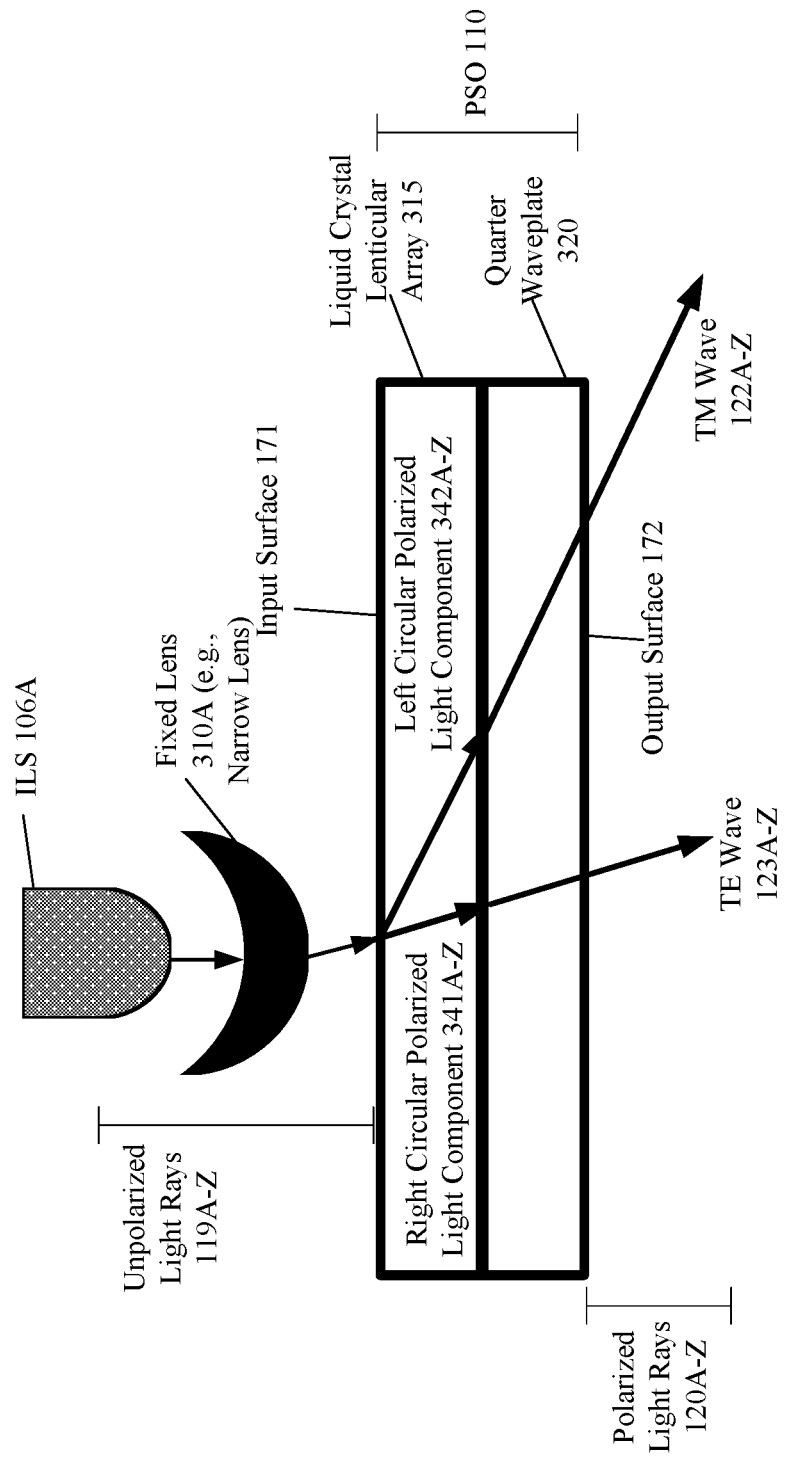
FIG. 3B is a zoomed in view of the boxed detail area A of FIG. 3A and shows additional details of a first conversion example of unpolarized light rays into polarized light rays by the polarization selection optic including the liquid crystal lenticular array and the quarter waveplate.

FIG. 3B is a zoomed in view of the boxed detail area A of FIG. 3A and shows additional details of a first conversion example of unpolarized light rays 119A-Z into polarized light rays 120A-Z by the polarization selection optic 110 including the liquid crystal lenticular array 315 and the quarter waveplate 320. As shown in FIG. 3B, the quarter waveplate 320 converts the right circular polarized light component 341A-Z into the TE wave 123A-Z and the left circular polarized light component 342A-Z into the TM wave 122A-Z or vice versa by: (i) retarding the right circular polarized light component 341A-Z into the TE wave 123A-Z, and (ii) retarding the left circular polarized light component 342A-Z into the TM wave 122A-Z.

FIG. 3C is another zoomed in view of the boxed detail area A of FIG. 3A and shows additional details of a second conversion example of unpolarized light rays 119A-Z into polarized light rays 120A-Z by the polarization selection optic 110 including the liquid crystal lenticular array 315 and the quarter waveplate 320. In FIG. 3C, the quarter waveplate 320 converts the right circular polarized light component 341A-Z into the TE wave 123A-Z and the left circular polarized light component 342A-Z into the TM wave 122A-Z or vice versa by: (i) retarding the right circular polarized light component 341A-Z into the TM wave 122A-Z, and (ii) retarding the left circular polarized light component 342A-Z into the TE wave 123A-Z.

Figure 3E:
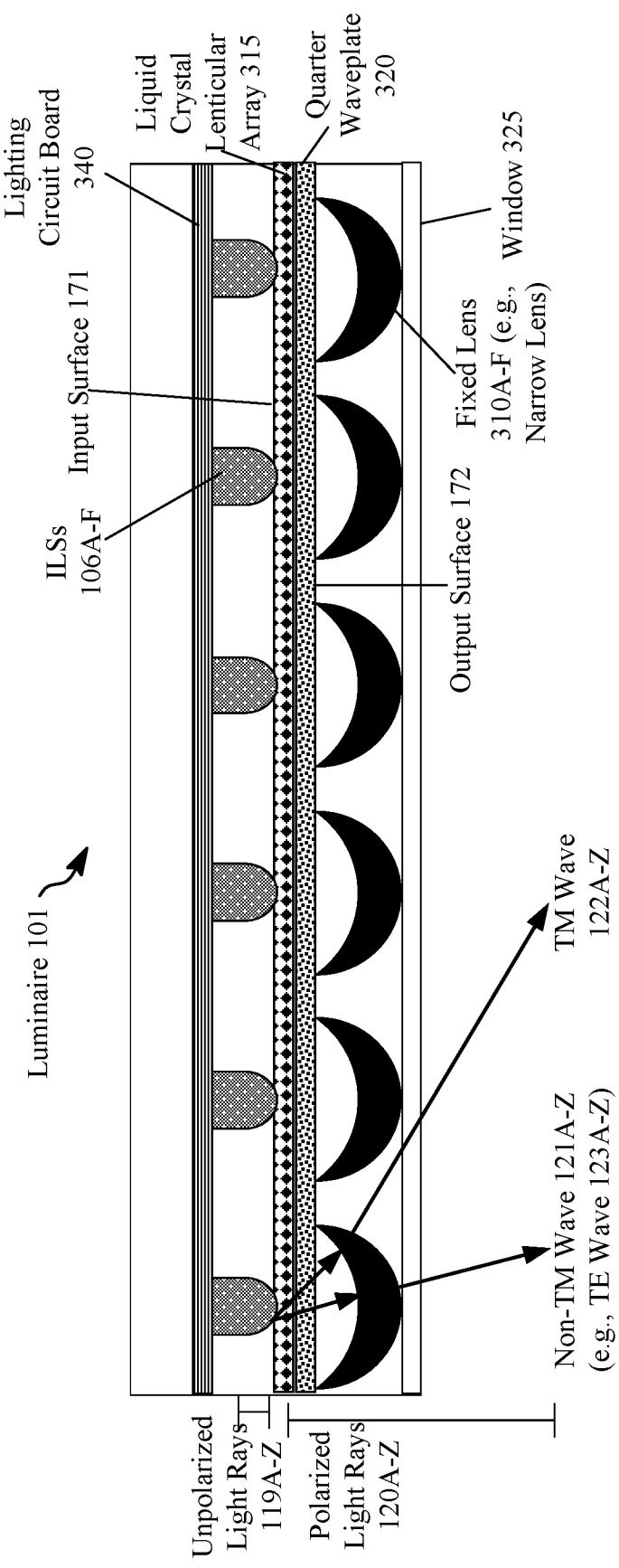
FIG. 3E is another enlarged view of a section of the luminaire of the lighting device of FIGS. 1A-B and 2, corresponding to the dashed circle A-A in FIG. 2, in which the unpolarized light rays first pass through the liquid crystal lenticular array and the quarter waveplate of the polarization selective optic and then pass through the fixed lens.

FIGS. 3D-E show that the three elements: (i) fixed lenses 310A-F, (ii) liquid crystal lenticular array 315, and (iii) quarter waveplate 320 of FIGS. 3A-C can be coupled in two different orders. Hence, FIG. 3D is another enlarged view of a section of the luminaire 101 of the lighting device 100 of FIGS. 1A-B and 2, corresponding to the dashed circle A-A in FIG. 2, in which the fixed lens 310A is located between the liquid crystal lenticular array 315 and the quarter waveplate 320 of the polarization selective optic 110.

FIG. 3E is another enlarged view of a section of the luminaire 101 of the lighting device 100 of FIGS. 1A-B and 2, corresponding to the dashed circle A-A in FIG. 2. The unpolarized light rays 119A-Z initially pass through the liquid crystal lenticular array 315 to be converted into a right circular polarized light component 341A-Z and a left circular polarized light component 342A-Z. The right circular polarized light component 341A-Z and the left circular polarized light component 342A-Z then pass through the quarter waveplate 320 to be retarded into the TM wave 122A-Z and the TE wave 123A-Z. The TM wave 122A-Z and the TE wave 123A-Z then finally pass through the fixed lens 310A.

FIG. 4A is an enlarged view of a section of the luminaire 101 of the lighting device 100 of FIGS. 1A-B and 2, corresponding to the dashed circle A-A in FIG. 2, showing six of the illumination light sources 106A-F and the polarization selection optic 110 including a polarizing meta-lens 414. The polarizing meta-lens 414 utilizes the wavelength properties of light to redirect optical energy and is designed to have specific properties, such as directing the TM wave 122A-Z and the TE wave 123A-Z in different directions, specifically to the far field 112 and near field 111, respectively.

As shown in FIG. 4A, the polarizing meta-lens 414 includes a non-grazing angle meta-lens layer 415 and a grazing angle meta-lens layer 420. Alternatively, the polarizing meta-lens 414 is formed of a single layer by having both the non-grazing angle meta-lens and a grazing angle meta-lens are not separate layers and instead reside in the same layer. Alternatively, the polarizing meta-lens 414 includes three or more layers forming the non-grazing angle meta-lens and a grazing angle meta-lens. The non-grazing angle meta-lens layer 415 converts a first subset of the unpolarized light rays 119A-Z into the TE wave 123A-Z and steers the TE wave 123A-Z to the near field 111 at the non-grazing angle 113. The grazing angle meta-lens layer 420 converts a second subset of the unpolarized light rays 119A-Z into the TM wave 122A-Z and only steers the vertically polarized light 122A-Z component to the far field 112 at the grazing angle 114.

FIG. 4B is a zoomed in view of the boxed detail area B of FIG. 4A and shows additional details of a third conversion example of unpolarized light rays 119A-Z into polarized light rays 120A-Z by the polarization selection optic 110 including the polarizing meta-lens 414. As shown in FIG. 4B, a beam pattern 430 of the illumination lighting 144 includes the TE wave 123A-Z surrounded by an annular ring 450 of the TM wave 122A-Z. In most applications, the illumination lighting 144 includes annular rings. For example, the vertically polarized light 122A-Z is oriented as an annular ring 450 forming an outer peripheral band around the horizontally polarizing light component 123A-Z. As shown, the TM wave 122A-Z surrounds a centralized horizontally polarizing light component 123A-Z. The dividing line between non-grazing angle 113 and grazing angle 114 light appears as a sharp line in FIG. 4B; however, typically there is a transition zone between the vertically polarized light 122A-Z and the horizontally polarizing light component 123A-Z of the beam pattern 430.

Figure 5A:
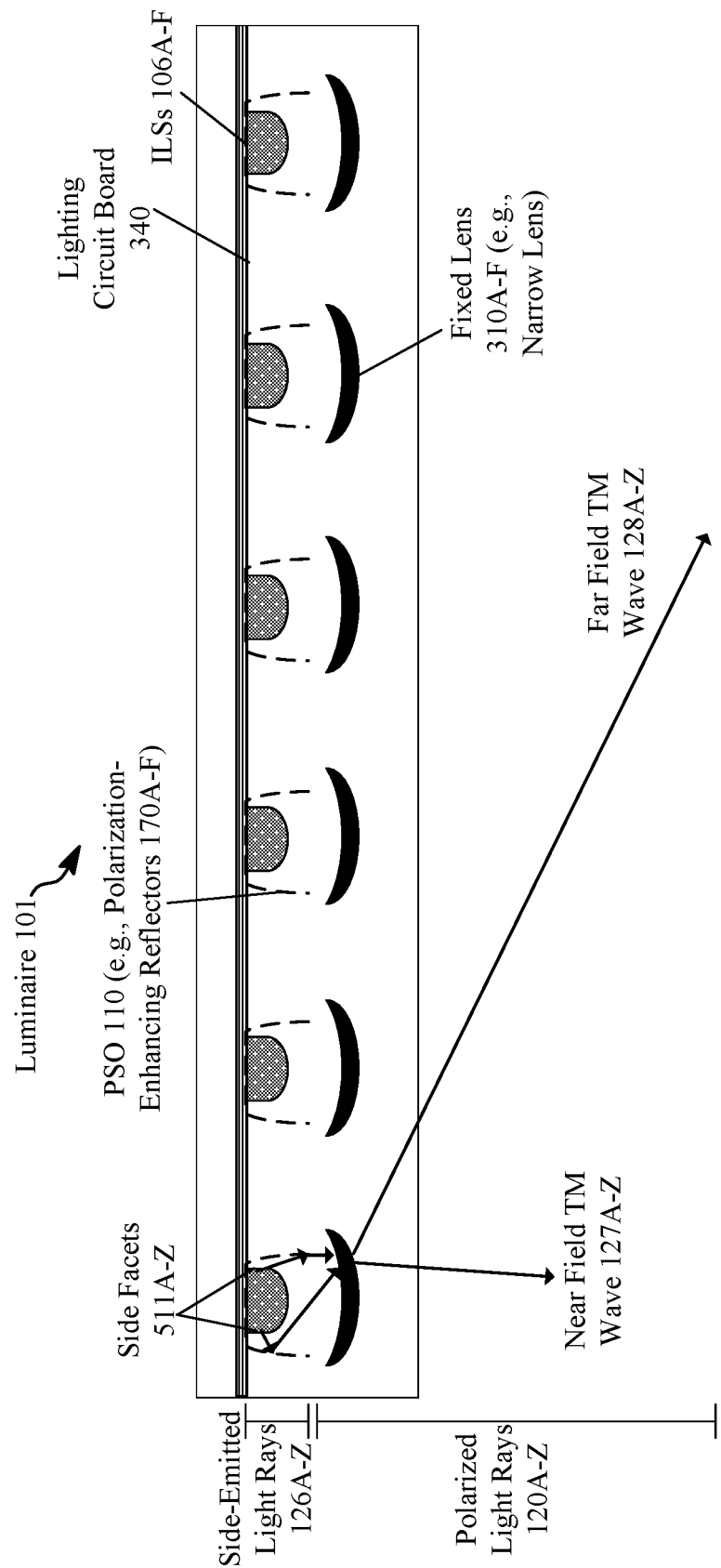
FIG. 5A is an enlarged view of a section of another alternate implementation of the luminaire of the lighting device of FIGS. 1A, 1C and 2, corresponding to the dashed circle A-A in FIG. 2, showing six of the illumination light sources and a polarization selection optic including a polarization-enhancing reflector.
Figure 5B:
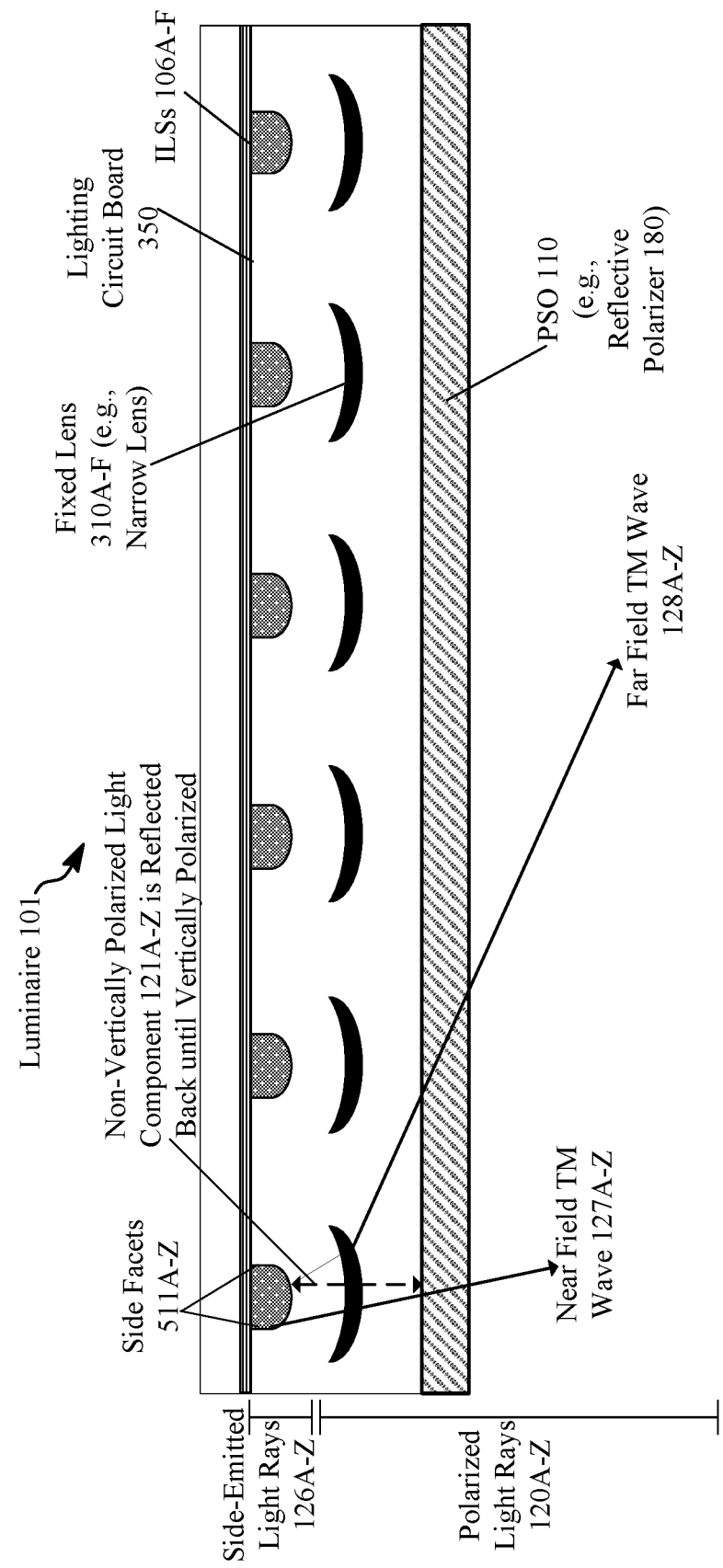
FIG. 5B is another enlarged view of a section of the luminaire of the lighting device of FIGS. 1A, 1C, and 2, corresponding to the dashed circle A-A in FIG. 2, in which the polarization selective optic includes a reflective polarizer.

FIG. 5A is an enlarged view of a section of the luminaire 101 of the lighting device 100 of FIGS. 1A, 1C, and 2, corresponding to the dashed circle A-A in FIG. 2, showing six of the illumination light sources 106A-F and the polarization selection optic 110 including multiple polarization-enhancing reflectors 170A-F. As shown, a respective illumination light source 106A-F is coupled to a respective polarization-enhancing reflector 170A-F.

In both FIGS. 5A-B, which correspond to FIG. 1C, the polarization selective optic 110 includes a polarization-enhancing reflector 170A-F or a reflective polarizer 180. The TM wave 122A-Z includes a near field TM wave subcomponent 127A-Z and a far field TM wave subcomponent 128A-Z. The polarization selective optic 110 reflects or rotates the near field TM wave subcomponent 127A-Z to be outputted to a near field 111 at a non-grazing angle 113. The polarization selective optic 110 reflects or rotates the far field TM wave subcomponent 128A-Z to be outputted to the far field 112 at a grazing angle 114. As shown, the illumination light source matrix 105 includes multiple illumination light sources 106A-F. Each of the illumination light sources 106A-F includes a red light emitting diode (LED), a blue LED, and a green LED to produce the incoming light rays 118A-Z (e.g., side-emitted light rays 126A-Z) as white light. In another example, each of the illumination light sources 106A-F includes two LEDs, such as blue and yellow. In yet another example, each of the illumination light sources 106A-F includes four LEDs, such as blue, green, yellow, and red which provides a better color palette and color rendering. More than five LEDs can be utilized to improve the color palette and color rendering. Alternatively or additionally, each of the illumination light sources 106A-F includes a red laser light source, a blue laser light source, and a green laser light source to produce the incoming light rays 118A-Z (e.g., side-emitted light rays 126A-Z) as white light.

Returning more specifically to FIG. 5A, the incoming light rays 118A-Z include side-emitted light rays 126A-Z emitted from side facets 511A-Z of the illumination light source 106A that are polarized. The polarization selective optic 110 includes a polarization-enhancing reflector 170A coupled to the illumination light source 106A. An example of a polarization-enhancing reflector 170A is disclosed in U.S. Patent Publication No. 2008/0316751 to Tigran Galstian, et al., published Dec. 25, 2008, titled "Reflector shapes for light emitting diode-polarized light sources," which is incorporated by reference as if fully set forth herein. Light emitted by the illumination light source 106A is primarily polarized in-plane and the polarization-enhancing reflector 170A selectively rotates the polarization of side-emitted light rays 126A-Z (e.g., depending on the emission alignment or direction) to convert in-plane polarized light to the near field TM wave subcomponent 127A-Z and the far field TM wave subcomponent 128A-Z. The polarization-enhancing reflector 170A varies an optical path of the incoming light rays 118A-Z based upon a respective emission alignment of the incoming light rays 118A-Z to reflect or rotate the side-emitted light rays 126A-Z into the near field TM wave subcomponent 127A-Z and the far field TM wave subcomponent 128A-Z. Through the selective polarization rotation, all side-emitted light rays 126A-Z, which are initially polarized in the plane of the quantum well, is polarized along a single vertical polarization direction when leaving the reflective polarizer 180.

In FIG. 5A, each of the illumination light sources 106A-X includes the red LED, the blue LED, and the green LED. Each of the illumination light sources 106A-X includes indium gallium nitride (GaInN) as a light-emitting layer grown on a gallium nitride buffer formed on a transparent substrate that includes sapphire, silicon carbide, or a combination thereof. GaInN LEDs on sapphire substrates with multiple quantum well (MQW) active regions emitting at 460 nm emit side-emitted light rays 126A-Z from the side facets 511A-Z of the LED chip that is dominantly polarized in the plane of the quantum wells, with values as high as 7:1 for the ratio of in-plane polarized light to normal-to-plane polarized light.

FIG. 5B is another enlarged view of a section of the luminaire 101 of the lighting device 100 of FIGS. 1A, 1C, and 2, corresponding to the dashed circle A-A in FIG. 2, in which the polarization selective optic 110 includes a reflective polarizer 180. The reflective polarizer 180 can be a cube beamsplitter, plate beamsplitter, or thin film, which reflects the substantially non-TM wave 121A-Z unwanted polarization state while transmitting the desired TM wave 122A-Z. Reflective polarizer 180 can utilize a wire grid, Brewster's angle, or interference effects. Brewster's angle is the angle at which, based on the Fresnel equations, only s-polarized light is reflected. Because the p-polarized light is not reflected while the s-polarized light is partially reflected, the transmitted light is enriched in p-polarization. Hence, reflective polarizer 180 can include a Brewster window, broadband polarizing plate beamsplitter, broadband polarizing cube beamsplitter, wire grid polarizer, or wire grid polarizing cube beamsplitter.

As shown in FIG. 5B, the incoming light rays 118A-Z include side-emitted light rays 126A-Z emitted from side facets 511A-Z of the illumination light source 106A that are polarized. The reflective polarizer 180 emits the near field TM wave subcomponent 127A-Z and the far field TM wave subcomponent 128A-Z. The reflective polarizer 180 reflects the substantially non-TM wave 121A-Z back to the illumination light source 106A.

Figure 6:
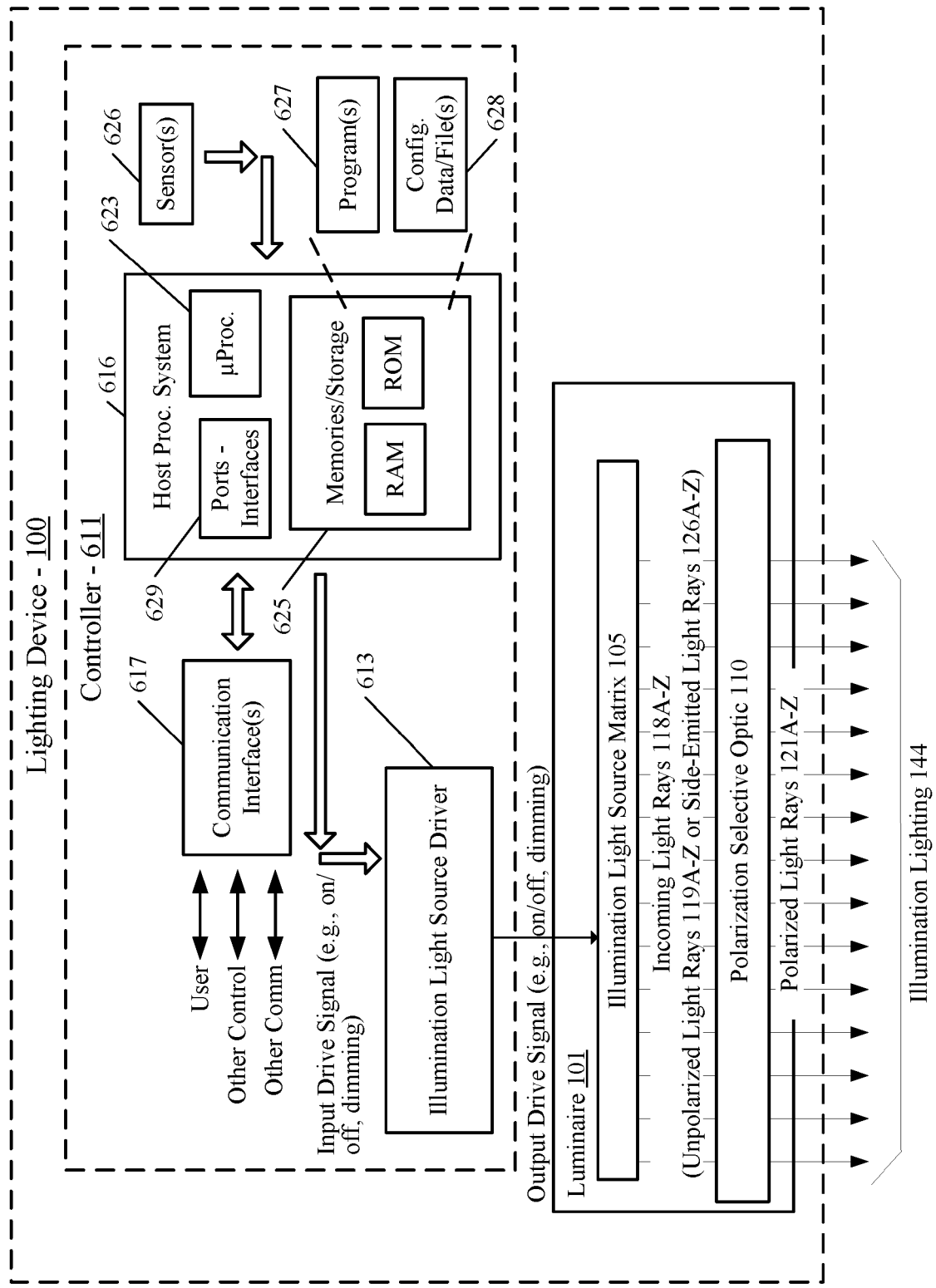
FIG. 6 is a functional block diagram of an example of a lighting device including an illumination light source driver and a luminaire that has the illumination light source matrix and a polarization selective optic to control glare.

FIG. 6 is a functional block diagram of an example of a lighting device 100 including an illumination light source driver 613 and a luminaire 101 that has the illumination light source matrix 105 and a polarization selective optic 110 to control glare. In some examples, the luminaire 101 of the lighting device 100 may be a dumb lighting device, for example, that is merely controlled by a light switch or always in an on state and not controlled by a light switch at all. The depicted components of the luminaire 101 may be coupled without or with air gaps. The drawing (FIG. 6) shows the inclusion of the luminaire 101 in a lighting device 100, together with a suitable controller 611. As shown in FIG. 6, the controller 611 includes the illumination light source driver 613 coupled to the luminaire 101 and a host processing system 616. The controller 611 may also include one or more communication interfaces 617 and one or more sensors 626.

Luminaire 101 provides illumination lighting 144 in response to lighting control signals received from the driver system, shown as illumination light source driver 613, for example, based on an illumination application (stored as program(s) 627). Illumination light source driver 613 selectively controls the illumination light source matrix 105 to emit the incoming light rays 118A-Z (e.g., unpolarized light rays 119A-Z or side-emitted light rays 126A-Z). Illumination light source driver 613 is configured and coupled to supply suitable power to drive the particular implementation of the illumination light source matrix 105. The illumination lighting 144 emitted from the luminaire 101 with the outputted beam pattern 430 has an intensity and/or other characteristic(s) that satisfy an industry acceptable performance standard for a general lighting application.

In an example, the luminaire 101 includes illumination light source matrix 105, which emits incoming light rays 118A-Z. As described above, the illumination light source matrix 105 is comprised of multiple illumination light sources 106A-X. Illumination light sources 106A-X of the illumination light source matrix 105 are coupled directly or indirectly to the polarization selective 110, for example, without or with an air gap. To control glare, polarization selective optic 110 emits the polarized light rays 121A-Z for illumination lighting 144 as a desired outputted beam pattern 430. The desired beam pattern 430 emitted by the polarization selective optic 110 steers a substantially non-TM wave 121A-Z to a near field 111 at a non-grazing angle 113 and steers a TM wave 122A-Z to a far field 112 at a grazing angle 114.

FIG. 6 also provides an example of an implementation of the high layer logic and communications elements to control luminaire operations to provide selected illumination light, e.g., for a general illumination application. As shown, the controller 611 includes a host processing system 616, one or more sensors 626 and one or more communication interface(s) 617. Other implementations of the circuitry of the controller 611 may be utilized. For the purpose of illumination operation, the circuitry of the controller 611, in the example, is coupled to the illumination light source matrix 105 to drive and control operation of the illumination light source matrix 105. The circuitry of the controller 611 may be configured to operate the illumination light source matrix 105 to generate the illumination lighting 144 at least during an illumination state of the luminaire 101. The controller 611 may implement a number of different illumination state configurations (e.g., on/off and dimming levels).

The host processing system 616 provides the high level logic or "brain" of the controller 611 and thus of the lighting device 100. In the example, the host processing system 616 includes memories/storage 625, such as a random access memory and/or a read-only memory, as well as programs 627 stored in one or more of the memories/storage 625. The programming 627, in one example, configures the lighting device 100 to implement illumination states of the controlled luminaire 101. As an alternative to distinct states, the programming 627 may configure the lighting device 100 to implement a step-wise or substantially continuous adjustment of the relative intensities of the illumination light outputs of the controlled luminaire 101, encompassing settings to achieve the relative intensity levels of the states.

The memories/storage 625 may also store various data, including luminaire configuration information 628 or one or more configuration files containing such information, in addition to the illustrated programming 627. The host processing system 616 also includes a central processing unit (CPU), shown by way of example as a microprocessor (μP) 623, although other processor hardware may serve as the CPU.

As shown, the microprocessor 623 produces an input drive signal, which is conveyed to the illumination light source driver 613 to ultimately switch the illumination light sources 106A-X of the illumination light source matrix 105 on/off or set a dim level. The illumination light source driver 613 produces an output drive signal, which switches the illumination light sources 106A-X on/off or sets a dim level based on the input drive signal.

The ports and/or interfaces 629 couple the processor 623 to various elements of the lighting device 100 logically outside the host processing system 616, such as the illumination light source driver 613, the communication interface(s) 617 and the sensor(s) 626. For example, the processor 623 by accessing programming 627 in the memory 625 controls operation of the illumination light source driver 613 and thus operations of the luminaire 101 via one or more of the ports and/or interfaces 629. In a similar fashion, one or more of the ports and/or interfaces 629 enable the processor 623 of the host processing system 116 to use and communicate externally via the communication interface(s) 617; and the one or more of the ports 629 enable the processor 623 of the host processing system 616 to receive data regarding any condition detected by a sensor 626 for further processing.

In the operational examples, based on its programming 627, the processor 623 processes data retrieved from the memory 625 and/or other data storage, and responds to light output parameters in the retrieved data to control the light generation by the luminaire 101, particularly the illumination light sources 106A-X. The light output control also may be responsive to sensor data from a sensor 626. The light output parameters may include light intensity and light color characteristics of light from illumination light sources 106A-X. The light output parameters may also control modulation of the light output, e.g., to carry information on the illumination lighting 144 output of the luminaire 101.

As noted, the host processing system 616 is coupled to the communication interface(s) 617. The communication interface(s) 617 may communicate with other control elements, for example, a host computer of a building control and automation system (BCAS). The communication interface(s) 617 may also support device communication with a variety of other equipment of other parties having access to the lighting device 100 in an overall/networked lighting system encompassing a number of lighting devices 100, e.g., for access to each lighting device 100 by equipment of a manufacturer for maintenance or access to an on-line server for downloading of programming instruction or configuration data for setting aspects of luminaire operation.

As outlined earlier, the host processing system 616 also is coupled to the illumination light source driver 613. The illumination light source driver 613 is coupled to the illumination light source matrix 105. Illumination light source driver 613 may be a single integral unit or implemented in a variety of different configurations having any number of internal driver units. The separate drivers may be circuits configured to provide signals appropriate to the respective type of illumination light source driver 613 utilized in the particular implementation of the luminaire 101, albeit in response to commands or control signals or the like from the host processing system 616.

The host processing system 616 and the illumination light source driver 613 provide a number of control functions for controlling operation of the luminaire 101, including in the illumination states. In a typical example, execution of the programming 627 by the host processing system 616 and associated control via the illumination light source driver 613 configures the lighting device 100 to perform functions, including functions to operate the illumination light source matrix 105 to provide light output from the luminaire 101, e.g., based on the lighting device configuration information 628.

In an example of the operation of the luminaire 101, the processor 623 receives a configuration file 628 via one or more of communication interfaces 617. For illumination control, the configuration information in the configuration file 628 may specify operational parameters of the luminaire 101, such as light intensity, light color characteristic, and the like for light from the illumination light source matrix 105. Configuration file 628 may also specify which of the illumination light sources 106A-X in the illumination light source matrix 105 to turn off, on, or dim (e.g., outer, inner, middle, left, right) along with light intensity and color setting to achieve particular beam patterns, angles, and lighting distributions via the polarization selective optic 110. The processor 623 by accessing programming 627 and using software configuration information 628, from the storage/memories 625, controls operation of the illumination light source driver 613, and through that driver 613 controls the illumination light source matrix 105, e.g., to achieve a predetermined beam pattern 430 for glare control, illumination light output intensity, and/or color characteristic for a general illumination application of the luminaire 101, including settings for the illumination light source matrix 105 appropriate to the current one of the beam pattern 430 or luminaire states.

The lighting device 100 may be reconfigured, e.g., to change one or more parameters of the illumination light output, by changing the corresponding aspect(s) of the configuration data file 628, by replacing the configuration data file 628, or by selecting a different file from among a number of such files already stored in the data storage/memories 625.

In other examples, the lighting device 100 may be programmed to transmit information on the light output from the luminaire 101. Examples of information that the lighting device 100 may transmit in this way include a code, e.g., to identify the luminaire 101 and/or the lighting device 100 or to identify the luminaire location. Alternatively or in addition, the light output from the luminaire 101 may carry downstream transmission of communication signaling and/or user data. The information or data transmission may involve adjusting or modulating parameters (e.g., intensity, color characteristic or the like) of the illumination light output of the luminaire 101. Alternatively, user data may be received via one of the communication interface(s) 617 and processed in the controller 611 to transmit such received user data via light output from the luminaire 101.

Although specially configured circuitry may be used in place of microprocessor 623 and/or the entire host processing system 616, the drawing depicts an example of the controller 611 in which functions relating to the controlled operation of the lighting device 100, including operation of the luminaire 101, may be implemented by the programming 627 and/or configuration data 628 stored in a memory device 625 for execution by the microprocessor 623. The programming 627 and/or data 628 configure the processor 623 to control system operations so as to implement functions of the lighting device 100 described herein.

Aspects of the software configurable lighting device 100 example therefore include "products" or "articles of manufacture" typically in the form of software or firmware that include executable code of programming 627 and/or associated configuration data 628 that is/are carried on or embodied in a type of machine readable medium. "Storage" type media include any or all of storage devices that may be used to implement the memory 625, any tangible memory of computers or the like that may communicate with the lighting device 100 or associated modules of such other equipment. Examples of storage media include but are not limited to various semiconductor memories, tape drives, disk drives and the like, which may provide non-transitory storage at any time for the software or firmware programming 627 and/or the configuration data 628. All or portions of the programming and/or data may at times be communicated through the Internet or various other telecommunication networks. Such communications, for example, may enable loading of the programming and/or data from a computer or the like into the host processing system 616 of the controller 611, for example, from a management server or host computer of the lighting system service provider into a lighting device 100. Thus, another type of media that may bear the programming 627 and/or the data 628 includes optical, electrical and electromagnetic waves, such as used across physical interfaces between local devices, through wired and optical landline networks and over various airlinks. The physical elements that carry such waves, such as wired or wireless links, optical links or the like, also may be considered as media bearing the software. As used herein, unless restricted to non-transitory, tangible or "storage" media, terms such as computer or machine "readable medium" refer to any medium that participates in providing instructions to a processor for execution.

Unless otherwise stated, any and all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like may vary by as much as 10% from the stated amount. The terms "approximately" and "substantially" mean that the parameter value or the like varies up to 10% from the stated amount (e.g., angle value).

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, the subject matter to be protected lies in less than all features of any single disclosed example. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. A luminaire including:
   an illumination light source configured to be driven by electrical power to emit incoming light rays; and
   a polarization selective optic coupled to the illumination light source to receive the incoming light rays emitted by the illumination light source and output polarized light rays for illumination lighting, wherein:
      based on the incoming light rays, the polarization selective optic outputs the polarized light rays including a TM wave, and
      the polarization selective optic steers the TM wave to be outputted to a far field at a grazing angle.

2. The luminaire of claim 1, wherein the polarization selective optic includes:
   (i) a liquid crystal lenticular array and a quarter waveplate;
   (ii) a polarizing meta-lens;
   (iii) a polarization-enhancing reflector; or
   (iv) a reflective polarizer.

3. The luminaire of claim 2, wherein:
   the polarization selective optic includes: (i) the liquid crystal lenticular array and the quarter waveplate, or (i) the polarizing meta-lens;
   the incoming light rays emitted by the illumination Hgt source include unpolarized light rays;
   the polarization selective optic includes an input surface coupled to receive the unpolarized light rays emitted by the illumination Hgt source and an output surface to output the polarized output light rays for the illumination lighting;
   the polarization selective optic converts the unpolarized light rays into the polarized light rays including the TM wave; and
   the polarization selective optic steers the TM wave through the output surface to be outputted to the far field at the grazing angle.

4. The luminaire of claim 3, wherein:
   the polarized light rays further include a TE wave; and
   the polarization selective optic steers the TE wave through the output surface to be outputted to a near field at a non-grazing angle.

5. The luminaire of claim 4, wherein:
   the polarization selective optic includes the liquid crystal lenticular array and the quarter waveplate;
   the liquid crystal lenticular array converts the unpolarized light rays into a right circular polarized light component and a left circular polarized light component; and
   the quarter waveplate is coupled to the liquid crystal lenticular array to:
      convert one of the right and left circular polarized Hgt components into the TE wave and convert another of the right and left circular polarized light components into the TM wave,
      steer the TE wave to the near field at the non-grazing angle, and
      only steer the TM wave to the far field at the grazing angle.

6. The luminaire of claim 5, wherein the liquid crystal lenticular array is a non-switchable polymerized liquid crystal lenticular array that is microscopically in a liquid state and macroscopically in a solid state.

7. The luminaire of claim 5, further comprising a fixed lens, wherein the fixed lens is located between the liquid crystal lenticular array and the quarter waveplate.

8. The luminaire of claim 5, further comprising a fixed lens, wherein:
   the unpolarized Hgt rays initially pass through the liquid crystal lenticular array to be converted into a right circular polarized light component and a left circular polarized light component;

the right circular polarized light component and the left circular polarized Hgt component then pass through the quarter waveplate to be retarded into the TM wave and the TE wave; and the TM wave and the TE wave then finally pass through the fixed lens.

9. The luminaire of claim 5, wherein:

the quarter waveplate converts the one of the right circular polarized light component into the TE wave and the other of the left circular polarized light component into the TM wave by:

retarding the right circular polarized light component into the TE wave, and retarding the left circular polarized light component into the TM wave.

10. The luminaire of claim 5, wherein:

the quarter waveplate converts the one of the right circular polarized light component into the TM wave and the other of the left circular polarized light component into the TE wave or by:

retarding the right circular polarized light component into the TM wave, and retarding the left circular polarized light component into the TE wave.

11. The luminaire of claim 4, wherein:

the polarization selective optic includes the polarizing meta-lens;

the polarizing meta-lens includes a non-grazing angle meta-lens layer and a grazing angle meta-lens layer, the non-grazing angle meta-lens layer converts a first subset of the unpolarized light rays into the TE wave and steers the TE wave to the near field at the non-grazing angle; and the grazing angle meta-lens layer converts a second subset of the unpolarized light rays into the TM wave and only steers the TM wave to the far field at the grazing angle.

12. The luminaire of claim 11, wherein a beam pattern of the illumination lighting includes the TE wave surrounded by an annular ring of the TM wave.

13. The luminaire of claim 2, wherein:

the polarization selective optic includes the polarization-enhancing reflector or the reflective polarizer;

the TM wave includes a near field TM wave subcomponent and a far field TM wave subcomponent;

the polarization selective optic reflects or rotates the near field TM wave subcomponent to be outputted to a near field at a non-grazing angle; and the polarization selective optic reflects or rotates the far field TM wave subcomponent to be outputted to the far field at the grazing angle.

14. The luminaire of claim 13, wherein:

the incoming light rays include side-emitted light rays emitted from side facets of the illumination light source that are polarized;

the polarization selective optic includes the polarization-enhancing reflector coupled to the illumination light source; and the polarization-enhancing reflector varies an optical path of the incoming light rays based upon a respective emission alignment of the incoming light rays to reflect or rotate the side-emitted light rays into the near field TM wave subcomponent and the far field TM wave subcomponent.

15. The luminaire of claim 13, wherein:

the incoming light rays include side-emitted light rays emitted from side facets of the illumination light source that are polarized;

the polarization selective optic includes the reflective polarizer;

the reflective polarizer emits the near field TM wave subcomponent and the far field TM wave subcomponent; and the reflective polarizer reflects a substantially non-TM wave back to the illumination light source.

16. The luminaire of claim 13, wherein the illumination light source matrix includes multiple illumination light sources.

17. The luminaire of claim 16, wherein each of the illumination light sources includes a red light emitting diode (LED), a blue LED, and a green LED to produce the incoming light rays as white light.

18. The luminaire of claim 17, wherein the illumination light source includes indium gallium nitride as a light-emitting layer grown on a gallium nitride buffer formed on a transparent substrate that includes sapphire, silicon carbide, or a combination thereof.

19. The luminaire of claim 16, wherein each of the illumination light sources includes a red laser light source, a blue laser light source, and a green laser light source to produce the incoming light rays as white light.

20. The luminaire of claim 16, wherein the illumination light sources are arranged in a first series of linear illumination light source rows and a second series of linear illumination light source columns.

21. The luminaire of claim 1, wherein:

the polarization selective optic steers a substantially non-vertically polarized light component away from the far field at the grazing angle.

22. The luminaire of claim 1, further comprising:

an illumination light source driver to control a light source operation of the illumination light source.

* * * * *